US011800632B2

(12) United States Patent
Kim et al.

(10) Patent No.: US 11,800,632 B2
(45) Date of Patent: Oct. 24, 2023

(54) ELECTRONIC DEVICE HAVING HEAT-RADIATING STRUCTURE

(71) Applicant: SAMSUNG ELECTRONICS CO., LTD., Suwon-si (KR)

(72) Inventors: Yonghwa Kim, Suwon-si (KR); Min Park, Suwon-si (KR); Dongil Son, Suwon-si (KR); Hyunwoo Sim, Suwon-si (KR); Jaedeok Lim, Suwon-si (KR); Chunghyo Jung, Suwon-si (KR); Seungbum Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 448 days.

(21) Appl. No.: 17/262,973

(22) PCT Filed: Jul. 24, 2019

(86) PCT No.: PCT/KR2019/009122
§ 371 (c)(1),
(2) Date: Jan. 25, 2021

(87) PCT Pub. No.: WO2020/022759
PCT Pub. Date: Jan. 30, 2020

(65) Prior Publication Data
US 2021/0274637 A1 Sep. 2, 2021

(30) Foreign Application Priority Data
Jul. 24, 2018 (KR) .................. 10-2018-0085985

(51) Int. Cl.
H05K 1/02 (2006.01)
(52) U.S. Cl.
CPC ......... H05K 1/0207 (2013.01); H05K 1/0209 (2013.01); H05K 1/0219 (2013.01)

(58) Field of Classification Search
CPC ...... H05K 1/02; H05K 1/0201; H05K 1/0203; H05K 1/0207; H05K 1/0209;
(Continued)

(56) References Cited
U.S. PATENT DOCUMENTS
7,292,441 B2 11/2007 Smalc et al.
9,614,271 B2 4/2017 Nakano et al.
(Continued)

FOREIGN PATENT DOCUMENTS
KR 10-2008-0082744 9/2008
KR 10-0935275 12/2009
(Continued)

OTHER PUBLICATIONS
International Search Report for PCT/KR2019/009122 dated Oct. 29, 2019, 5 pages.
(Continued)

Primary Examiner — Amir A Jalali
(74) Attorney, Agent, or Firm — Nixon & Vanderhye, P.C.

(57) ABSTRACT

According to various embodiments, an electronic device may include a first plate, a second plate facing away from the first plate, and a side member surrounding a space between the first plate and the second plate, a middle plate disposed in the space between the first plate and the second plate in parallel with the second plate, a first Printed Circuit Board (PCB) disposed in a space between the second plate and the middle plate, a first electronic component mounted on the first PCB between the first PCB and the middle plate, a first heat transfer structure disposed between the first electronic component and the middle plate, a second electronic component including a first surface disposed in the space and spaced apart from the first PCB, a second surface facing away from the first surface, and a side face substantially
(Continued)

perpendicular to the first surface or the second surface, and a second heat transfer structure. The second heat transfer structure may include a first thermal conductive layer including a first portion attached to the first surface or the second surface, and a second portion extending from the first portion toward the middle plate and at least partially having a thermal conductive path between the second electronic component and the middle plate, and a second electrical conductive layer including a third portion attached to the first portion so that the third portion constructs an electromagnetic shielding structure for the second electric component. Other various embodiments may also be possible.

15 Claims, 26 Drawing Sheets

(58) Field of Classification Search
CPC .... H05K 1/0216; H05K 1/0243; H05K 1/028; H05K 1/0296; H05K 1/11; H05K 1/144; H05K 1/18; H05K 1/181; H05K 1/189; H05K 7/20; H05K 7/2039; H05K 7/205; H05K 7/2089–209; H05K 7/1427; H05K 9/00; H05K 9/0054; H05K 9/0024; H05K 9/0081; H05K 5/00; H05K 5/0026; H05K 2201/10371; H05K 2201/10128; H05K 2201/056; H01L 23/34; H01L 23/36; H01L 23/367; H01L 23/3675; H01L 23/3735; G06F 1/20; G06F 1/203; G06F 1/1656
See application file for complete search history.

(56) References Cited

U.S. PATENT DOCUMENTS

| | | | |
|---|---|---|---|
| 10,334,716 B2 | 6/2019 | Strader et al. | |
| 2014/0117528 A1* | 5/2014 | Byun | H01L 23/367 257/713 |
| 2015/0261265 A1 | 9/2015 | Dean et al. | |
| 2017/0318713 A1 | 11/2017 | Bang et al. | |
| 2018/0321780 A1* | 11/2018 | Park | G06V 40/1306 |
| 2019/0067795 A1* | 2/2019 | Shin | H01Q 1/2283 |
| 2019/0312090 A1* | 10/2019 | Park | G06F 1/1626 |
| 2019/0386380 A1* | 12/2019 | Ham | H01Q 1/243 |
| 2020/0373647 A1* | 11/2020 | Lee | H01Q 15/008 |
| 2020/0381830 A1* | 12/2020 | Kim | H01Q 1/42 |
| 2020/0396871 A1* | 12/2020 | Yun | H01Q 1/243 |
| 2020/0404808 A1* | 12/2020 | Kim | H05K 7/20463 |
| 2021/0218129 A1* | 7/2021 | Kim | H01Q 1/52 |

FOREIGN PATENT DOCUMENTS

| | | |
|---|---|---|
| KR | 10-2014-0057147 | 5/2014 |
| KR | 10-2016-0132363 | 11/2016 |
| KR | 10-1757229 | 8/2017 |
| KR | 10-2017-0123747 | 11/2017 |
| KR | 10-2018-0026763 | 3/2018 |
| WO | 03/088729 | 10/2003 |

OTHER PUBLICATIONS

Written Opinion of the ISA for PCT/KR2019/009122 dated Oct. 29, 2019, 5 pages.

* cited by examiner

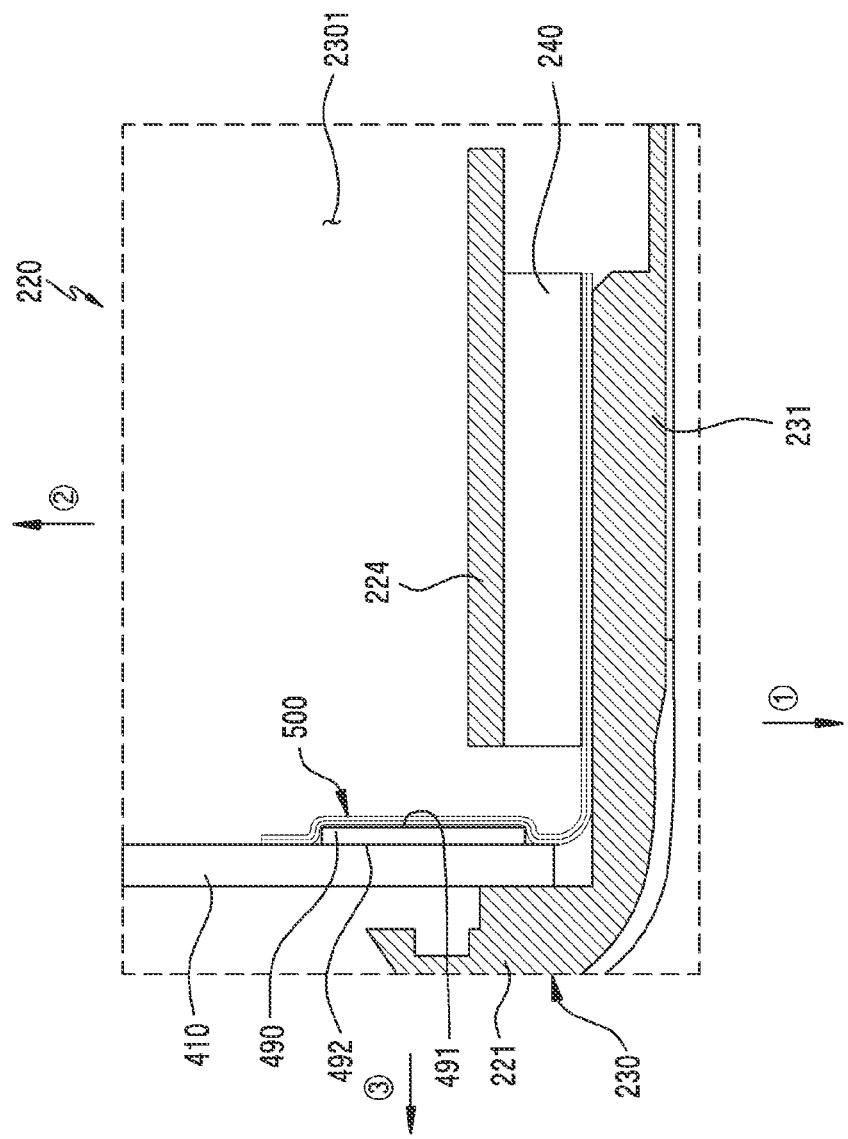

though the use of the ultra-high
ELECTRONIC DEVICE HAVING HEAT-RADIATING STRUCTURE This application is the U.S. national phase of International Application No. PCT/KR2019/009122 filed Jul. 24, 2019 which designated the U.S. and claims priority to KR Patent Application No. 10-2018-0085985 filed Jul. 24, 2018, the entire contents of each of which are hereby incorporated by reference.

BACKGROUND

Field

Various embodiments of the disclosure relate to an electronic device having a heat radiating structure.

Description of Related Art

With the development of wireless communication technologies, electronic devices (e.g., communication electronic devices) are widely used in everyday life, and thus the use of content increases exponentially. Due to the rapid increase in the use of the content, network capacity is gradually reaching a limit. As low latency data communication is required, there is on-going development in a next generation wireless communication technology (e.g., 5th Generation (5G) communication) or a high-speed wireless communication technology such as Wireless Gigabit alliance (WIGIG) (e.g., 802.11AD) or the like.

SUMMARY

A communication module using an ultra-high frequency band may include a substrate. At least one conductive member (e.g., a conductive pattern or a conductive pattern) used as an antenna radiator may be disposed to one face of the substrate, and a wireless communication circuit (e.g., a Radio Frequency (RF) module) electrically coupled with the conductive member may be mounted on the other face. For example, since the wireless communication circuit has a high possibility of noise generation due to the use of the ultra-high frequency band, a shield can may be disposed for noise shielding. Moreover, the wireless communication circuit may have a separate heat radiating structure due to severe heat generation caused by the use of the ultra-high frequency band. The heat radiating structure uses a separate shield can for heat radiation to which a Thermal Interface Material (TIM) is applied in addition to the shield can, which may result in an increase in volume. Alternatively, the shield can may be at least partially punctured to apply the TIM, which may lead to a deterioration in noise shielding performance.

Various embodiments of the disclosure may provide an electronic device having a heat radiating structure.

According to various embodiments, there may be provided an electronic device having a heat radiating structure capable of simultaneously implementing noise shielding and heat radiation for an electronic component.

According to various embodiments, there may be provided an electronic device having a heat radiating structure capable of effectively securing a mounting space even if a structure for noise shielding and heat radiation is applied.

According to various embodiments, an electronic device may include a housing including a first plate, a second plate facing away from the first plate, and a side member surrounding a space between the first plate and the second plate, a middle plate disposed in the space between the first plate and the second plate in parallel with the second plate, a first Printed Circuit Board (PCB) disposed in a space between the second plate and the middle plate, a first electronic component mounted on the first PCB between the first PCB and the middle plate, a first heat transfer structure disposed between the first electronic component and the middle plate, a second electronic component including a first surface disposed in the space and spaced apart from the first PCB, a second surface facing away from the first surface, and a side face substantially perpendicular to the first surface or the second surface, and a second heat transfer structure. The second heat transfer structure may include a first thermal conductive layer including a first portion attached to the first surface or the second surface, and a second portion extending from the first portion toward the middle plate and at least partially having a thermal conductive path between the second electronic component and the middle plate, and a second electrical conductive layer including a third portion attached to the first portion so that the third portion constructs an electromagnetic shielding structure for the second electric component.

According to various embodiments, since noise shielding and heat radiation for electronic components can be simultaneously performed while excluding a shield can, an additional mounting space of the components can be secured, and the components can be placed in various positions inside an electronic device by using a flexible material.

BRIEF DESCRIPTION OF THE DRAWINGS

FIG. 9 is a cross-sectional view illustrating essential components of an electronic device to which a heat transfer structure is applied according to various embodiments of the disclosure;

FIGS. 10A, 10B, 10C and 10D are a configuration diagram illustrating a shape of a thermal conductive layer in a heat transfer structure according to various embodiments of the disclosure;

DETAILED DESCRIPTION

Figure 1:
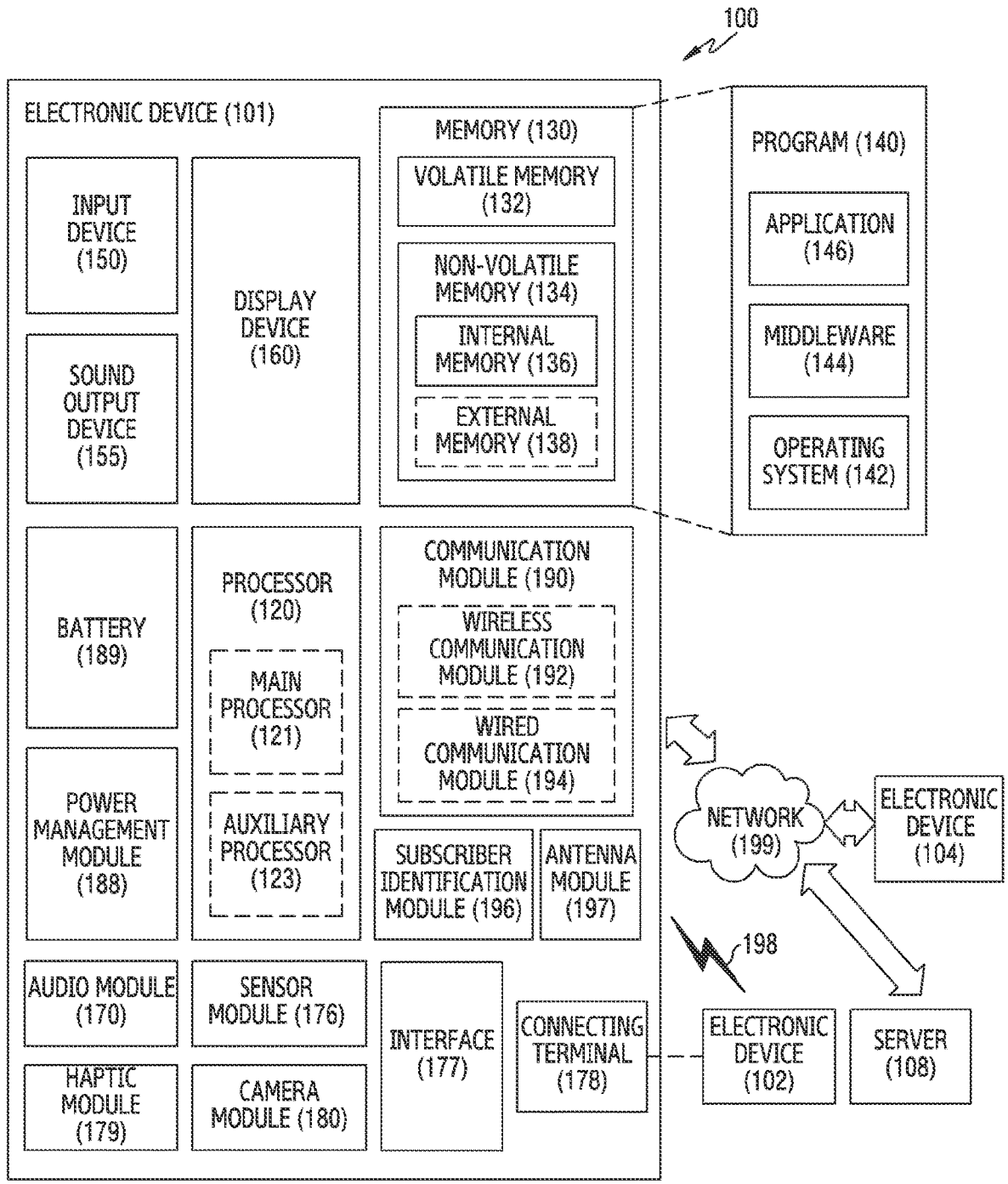
FIG. 1 is a block diagram of an electronic device in a network environment according to various embodiments.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector), The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above. It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2A:
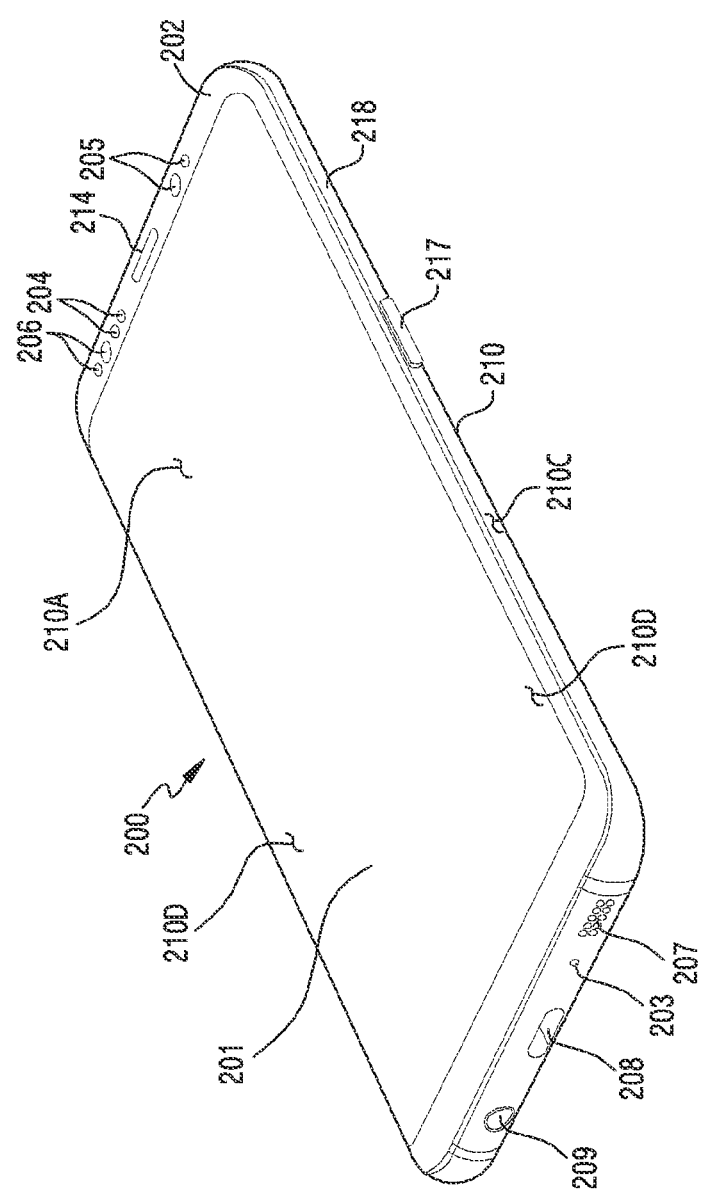
FIG. 2A is a front perspective view of a mobile electronic device according to various embodiments of the disclosure.
Figure 2B:
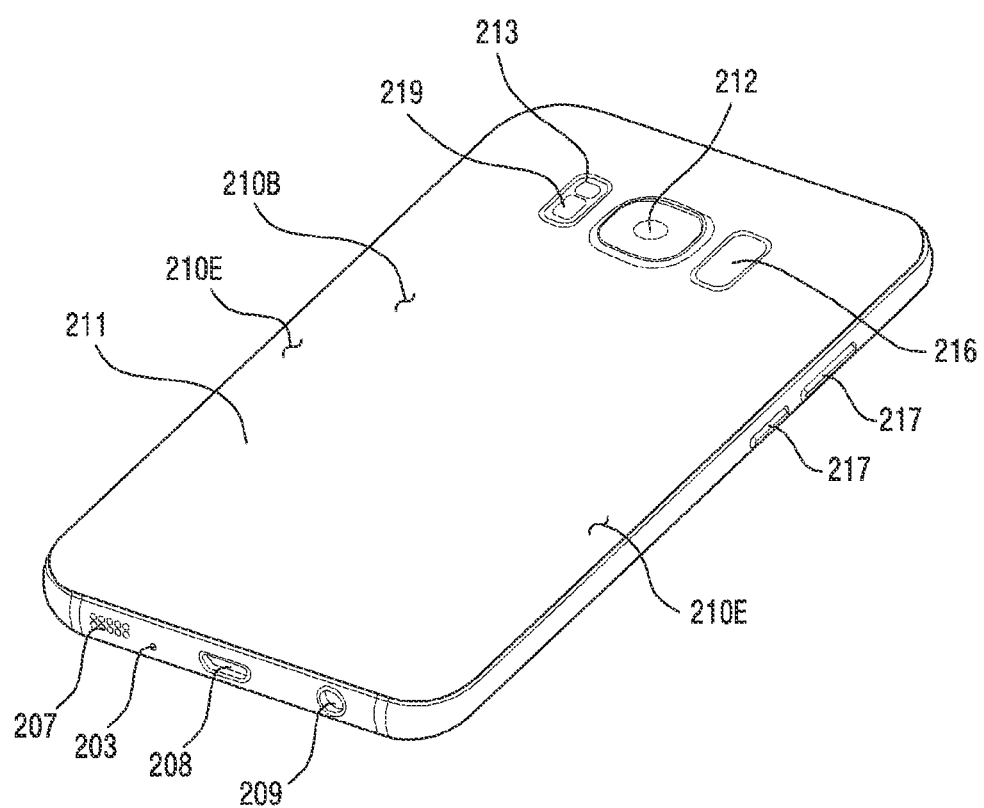
FIG. 2B is a rear perspective view of the electronic device of FIG. 2A according to various embodiments of the disclosure.

FIG. 2A is a front perspective view of a mobile electronic device 200 according to various embodiments of the disclosure. FIG. 2B is a rear perspective view of the mobile electronic device 200 of FIG. 2A according to various embodiments of the disclosure.

Referring to FIG. 2A and FIG. 2B, the mobile electronic device 200 according to an embodiment may include a housing 210 including a first face (or a front face) 210A, a second face (or a rear face) 210B, and a side face 210C surrounding a space between the first face 210A and the second face 210B. In another embodiment (not shown), the housing may refer to a structure which constitutes part of the first face 210A, second face 210B, and third face 210C of FIG. 2A. According to an embodiment, the first face 210A may be constructed of a front plate 202 (e.g., a polymer plate or a glass plate having various coating layers) which is at least partially transparent substantially. The second face 210B may be constructed of a back plate 211 which is opaque substantially. For example, the back plate 211 may be constructed of coated or colored glass, ceramic, polymer, metallic materials (e.g. aluminum, stainless steel (STS), or magnesium) or a combination of at least two of the these materials. The side face 210C may be constructed of a side bezel structure (or a side member) 218 joined with the front plate 202 and the back plate 211 and including metal and/or polymer. In some embodiments, the back plate 211 and the side bezel structure 218 may be constructed integrally and may include the same material (e.g., a metallic material such as aluminum).

In the illustrated embodiment, the front plate 202 may include two first regions 210D seamlessly extending by being bent from the first face 210A toward the back plate 211 at both ends of a long edge of the front plate 202. In the illustrated embodiment (see FIG. 2B), the back plate 211 may include two second regions 210E seamlessly extending by being bent from the second face 210B toward the front plate 202 at both ends of a long edge. In some embodiments, the front plate 202 (or the back plate 211) may include only one of the first regions 210D (or the second regions 210E). In another embodiment, part of the first regions 210D or the second regions 210E may not be included. In the above embodiments, in a side view of the electronic device 200, the side bezel structure 218 may have a first thickness (or width) at a side in which the first regions 210D or the second regions 210E is not included, and may have a second thickness thinner than the first thickness at a side in which the first regions 210E or the second regions 210E is included.

According to an embodiment, the electronic device 200 may include at least one or more of a display 201, audio modules 203, 207, and 214, sensor modules 204, 216, and 219, camera modules 205, 212, and 213, a key input device 217, a light emitting element 206, and connector holes 208 and 209. In some embodiments, the electronic device 200 may omit at least one of components (e.g., the key input device 217 or the light emitting element 206), or other components may be additionally included.

The display 201 may be exposed through, for example, some portions of the front plate 202. In some embodiments, at least part of the display 201 may be exposed through the first face 210A and the front plate 202 constructing the first regions 210E of the side face 210C. In some embodiments, a corner of the display 201 may be constructed to be substantially the same as an outer boundary adjacent to the front plate 202. In another embodiment (not shown), in order to expand an area in which the display 201 is exposed, the display 210 and the front plate 202 may be constructed to have substantially the same interval between outer boundaries thereof.

In another embodiment (not shown), a portion of a screen display region of the display 201 may have a recess or opening, and may include at least one or more of the audio module 214, sensor module 204, camera module 205, and light emitting element 206 which are aligned with the recess or the opening may be included. In another embodiment (not shown), at least one of the audio module 214, the sensor module 204, the camera module 205, the fingerprint sensor 216, and the light emitting element 206 may be included in a rear face of the screen display region of the display 201. In another embodiment (not shown), the display 201 may be disposed adjacent to or joined with a touch sensing circuit, a pressure sensor capable of measuring touch strength (pressure), and/or a digitizer for detecting a magnetic-type stylus pen. In some embodiments, at least part of the sensor modules 204 and 219 and/or at least part of the key input device 217 may be disposed to the first regions 210D and/or the second regions 210E.

The audio modules 203, 207, and 214 may include the microphone hole 203 or the speaker holes 207 and 214. A microphone for acquiring external sound may be disposed inside the microphone hole 203. In some embodiments, a plurality of microphones may be disposed to detect a direction of the sound. The speaker holes 207 and 214 may include the external speaker hole 207 and the receiver hole 214 for a call. In some embodiments, the speaker holes 207 and 214 and the microphone hole 203 may be implemented as one hole, or a speaker (e.g., a Piezo speaker) may be included without the speaker holes 207 and 214.

The sensor modules 204, 216, and 219 may generate an electrical signal or data value corresponding to an internal operational state of the electronic device 200 or an external environmental state. The sensor modules 204, 216, and 219 may include, for example, the first sensor module 204 (e.g., a proximity sensor) and/or second sensor module (not shown) (e.g., a fingerprint sensor) disposed to the first face 210A of the housing 210, and/or the third sensor module 219 (e.g., a Heart Rate Monitoring (HRM) sensor) disposed to the second face 210B of the housing 210 and/or the fourth sensor module 216 (e.g., a fingerprint sensor). The fingerprint sensor may be disposed not only to the first face 210A (e.g., the display 201) but also the second face 210B of the housing 210. The electronic device 200 may further include at least one of senor modules (not shown), for example, a gesture sensor, a gyro sensor, an atmospheric pressure sensor, a magnetic sensor, an acceleration sensor, a grip sensor, a color sensor, an Infrared (IR) sensor, a biometric sensor, a temperature sensor, a humidity sensor, and an illuminance sensor.

The camera modules 205, 212, and 213 may include the first camera module 205 disposed to the first face 210A of the electronic device 200, the second camera module 212 disposed to the second face 210B, and/or the flash 213. The camera module 205 and 212 may include one or more lenses, an image sensor, and/or an image signal processor. The flash 213 may include, for example, a Light Emitting Diode (LED) or a xenon lamp. In some embodiments, two or more lenses (infrared cameras, wide angle and telephoto lenses) and image sensors may be disposed to one face of the electronic device 200.

The key input device 217 may be disposed to the side face 210C of the housing 210. In another embodiment, the electronic device 200 may not include the entirety or part of the aforementioned key input device 217. The key input device 217, which is not included, may be implemented on a display 201 in a different form such as a soft key or the like. In some embodiments, the key input device may include the sensor module 216 disposed to the second face 210B of the housing 210.

The light emitting element 206 may be disposed, for example, to the first face 210A of the housing 210. The light emitting element 206 may provide, for example, state information of the electronic device 200 in an optical form. In another embodiment, the light emitting element 206 may provide, for example, a light source interworking with an operation of the camera module 205. The light emitting element 206 may include, for example, an LED, an IR LED, and a xenon lamp.

The connector holes 208 and 209 may include the first connector hole 208 capable of accommodating a connector (e.g., a USB connector) for transmitting/receiving power and/or data of an external electronic device and/or the second connector hole (e.g., earphone jack) 209 capable of accommodating a connector for transmitting/receiving an audio signal with respect to the external electronic device.

Figure 2C:
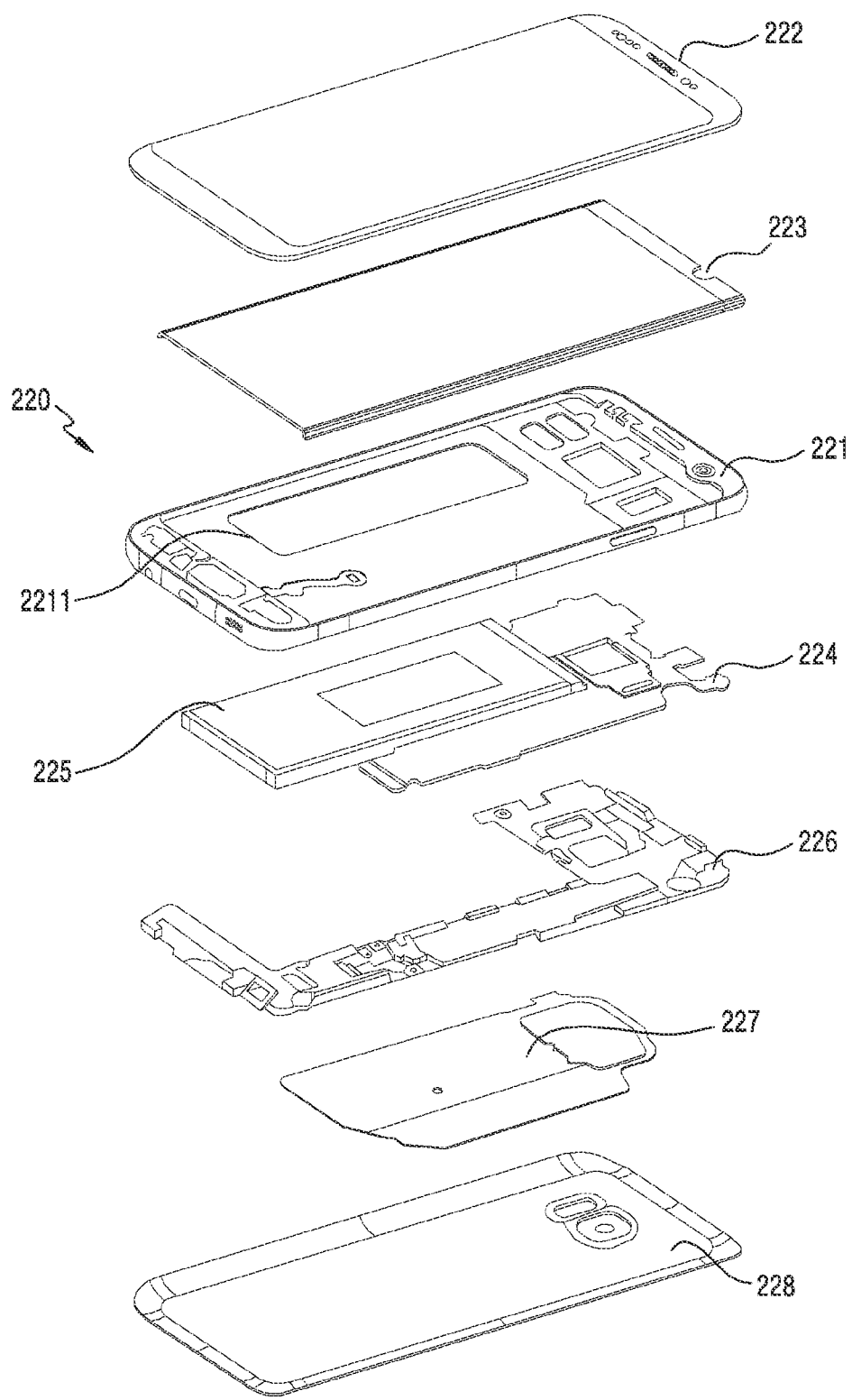
FIG. 2C is an exploded perspective view of an electronic device of according to various embodiments of the disclosure.

FIG. 2C is an exploded perspective view of a mobile electronic device of FIG. 2A (e.g., the mobile electronic device 200 of FIG. 2A) according to various embodiments of the disclosure.

Referring to FIG. 2C, a mobile electronic device 220 may include a side bezel structure 221, a first support member 2211 (e.g., a bracket, a middle plate), a front plate 222, a display 223, a Printed Circuit Board (PCB) 224 (e.g., a first PCB), a battery 225, a second support member 226 (e.g., a rear case), an antenna 227, and a back plate 228. In some embodiments, the electronic device 220 may omit at least one of these components (e.g., the first support member 2211 or the second support member 226), or may additionally include other components. At least one of the components of the electronic device 220 may be the same as or similar to at least one of the components of the electronic device 200 of FIG. 2A or FIG. 2B, and redundant descriptions will be omitted hereinafter.

The first support member 2211 may be coupled with the side bezel structure 221 by being disposed inside the electronic device 220, or may be constructed integrally with respect to the side bezel structure 221. The first support member 2211 may be constructed of, for example, a metal material and/or non-metal material (e.g., polymer). The display 223 may be bonded to one face of the first support member 2211, and the PCB 224 may be bonded to the other face thereof. A processor, a memory, and/or an interface may be mounted on the PCB 224. The processor may include, for example, one or more of a central processing unit, an application processor, a graphic processing unit, an image signal processor, a sensor hub processor, and a communication processor.

The memory may include, for example, a volatile memory or a non-volatile memory.

The interface may include, for example, a High Definition Multimedia Interface (HDMI), a Universal Serial Bus (USB) interface, a Secure Digital (SD) card interface, and/or an audio interface. For example, the interface may electrically or physically couple the electronic device 220 and the external electronic device, and may include a USB connector, an SD card/MMC connector, or an audio connector.

As a device for supplying power to at least one component of the electronic device 220, the battery 225 may include, for example, a non-rechargeable primary cell, a rechargeable secondary cell, or a fuel cell. At least part of the battery 225 may be disposed on the same plane substantially with respect to, for example, the PCB 224. The battery 225 may be disposed integrally inside the electronic device 220, or may be detachably disposed with respect to the electronic device 220.

The antenna 227 may be disposed between the back plate 228 and the battery 225. The antenna 227 may include, for example, a Near Field Communication (NFC) antenna, a wireless charging antenna, and/or a Magnetic Secure Transmission (MST) antenna. The antenna 227 may perform NFC, for example, with the external electronic device, or may wirelessly transmit/receive power required for charging. In another embodiment, an antenna structure may be constructed by at least part of the side bezel structure 221 and/or the first support member 2211 or a combination thereof.

Figure 3A:
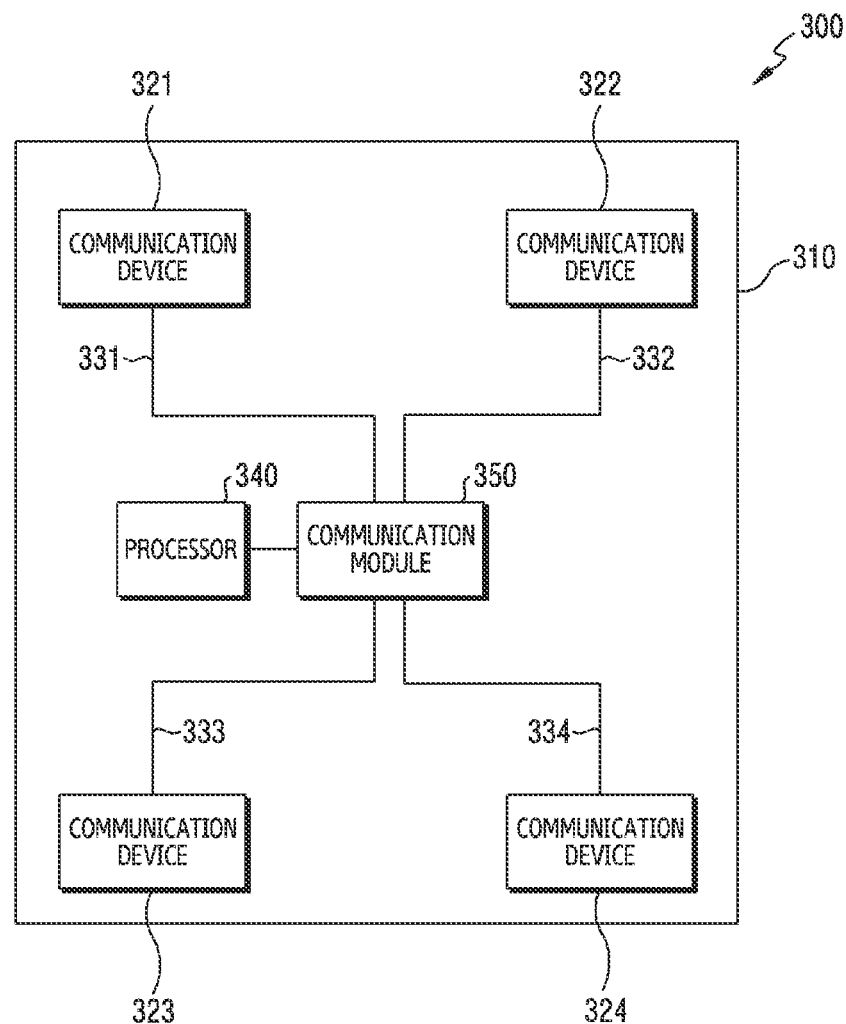
FIG. 3A illustrates an example of an electronic device supporting $5^{th}$ Generation (5G) communication according to various embodiments of the disclosure.

FIG. 3A illustrates an example of an electronic device 300 supporting 5G communication.

Referring to FIG. 3A, the electronic device 300 may include a housing 310, a processor 340, a communication module 350 (e.g., the communication module 190 of FIG. 1), a first communication device 321, a second communication device 322, a third communication device 323, a fourth communication device 324, a first conductive line 331, a second conductive line 332, a third conductive line 333, or a fourth conductive line 334.

According to an embodiment, the housing 310 may protect other components of the electronic device 300. The housing 310 may include, for example, a front plate, a back plate facing away from the front plate, and a side member (or a metal frame) attached to the back plate or constructed integrally with the back plate and surrounding a space between the front plate and the back plate.

According to an embodiment, the electronic device 300 may include the first communication device 321, the second communication device 322, the third communication device 323, or the fourth communication device 324.

According to an embodiment, the first communication device 321, the second communication device 322, the third communication device 323, or the fourth communication device 324 may be located inside the housing 310. According to an embodiment, when viewed from above the back plate of the electronic device, the first communication device 321 may be disposed to a left upper end of the electronic device 300, the second communication device 322 may be disposed to a right upper end of the electronic device 300, the third communication device 323 may be disposed to a left lower end of the electronic device 300, and the fourth communication device 324 may be disposed to a right lower end of the electronic device 300.

According to an embodiment, the processor 340 may include one or more of a central processing unit, a Graphic Processing Unit (GPU), an image signal processor of a camera, and a baseband processor (or a Communication Processor (CP)). According to an embodiment, the processor 340 may be implemented as a System on Chip (SoC) or a System in Package (SIP).

According to an embodiment, the communication module 350 may be electrically coupled with the first communication device 321, the second communication device 322, the third communication device 323, or the fourth communication device 324 by using the first conductive line 331, the second conductive line 332, the third conductive line 333, or the fourth conductive line 334. The communication unit 350 may include, for example, a baseband processor or at least one communication circuit (e.g., IFIC or RFIC). The communication module 350 may include, for example, a baseband processor separate from the processor 340 (e.g., an Application Processor (AP)). The first conductive line 331, the second conductive line 332, the third conductive line, or the fourth conductive line 334 may include, for example, a coaxial cable or an FPCB.

According to an embodiment, the communication module 350 may include a first Baseband Processor (BP) (not shown) or a second BP (not shown). The electronic device 300 may further include one or more interfaces between the first BP (or the second BP) and the processor 340 to support communication between chips. The processor 340 and the first BP or the second BP may transmit or receive data by using the interface between the chips (i.e., an inter-processor communication channel).

According to an embodiment, the first BP or the second BP may provide an interface for performing communication with different entities. The first BP may support wireless communication, for example, for a first network (not shown). The second BP may support wireless communication, for example, for a second network (not shown).

According to an embodiment, the first BP or the second BP may form one module together with the processor 340. For example, the first BP or the second BP may be integrally formed together with the processor 340. For another example, the first BP or the second BP may be disposed inside one chip, or may be formed as an independent chip. According to an embodiment, the processor 340 and at least one BP (e.g. the first BP) may be integrally formed inside one chip (SoC chip), and another BP (e.g., the second BP) may be formed as an independent chip.

According to an embodiment, the first network (not shown) or the second network (not shown) may correspond to the network 199 of FIG. According to an embodiment, each of the first network (not shown) and the second network (not shown) may include a 4th Generation (4G) network and a 5G network. The 4G network may support, for example, a Long Term Evolution (LTE) protocol defined in 3GPP. The 5G network may support, for example, a New Radio (NR) protocol defined in 3GPP.

Figure 3B:
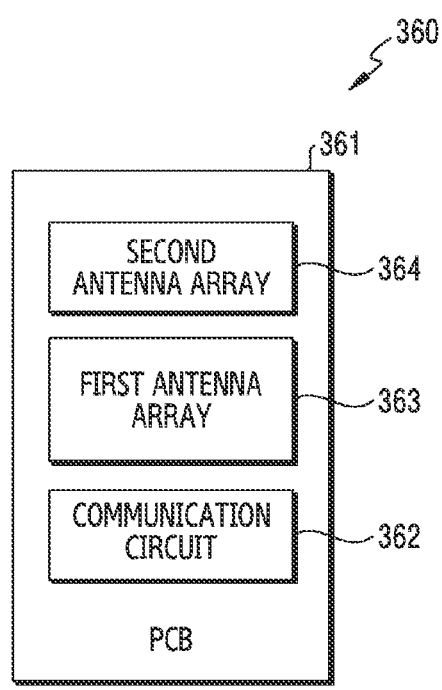
FIG. 3B is a block diagram of a communication device according to various embodiments of the disclosure.

FIG. 3B is a block diagram of a communication device 360 according to an embodiment.

Referring to FIG. 3B, the communication device 360 (e.g., the first communication device 321, second communication device 322, third communication device 323, and fourth communication device 324 of FIG. 3A) may include a communication circuit 362 (e.g., RFIC), a PCB 361, a first antenna array 363, or a second antenna array 364.

According to an embodiment, the communication circuit 362, the first antenna array 363, or the second antenna array 364 may be located in the PCB 361. For example, the first antenna array 363 or the second antenna array 364 may be disposed to a first face of the PCB 361, and the communication circuit 362 may be disposed to a second face of the PCB 361. The PCB 361 may include a connector (e.g., a coaxial cable connector or a Board to Board (B-to-B) connector) so as to be electrically coupled with another PCB (e.g., a PCB on which the communication module 350 of FIG. 3A is disposed) by using a transmission line (e.g., the first conductive line 331 of FIG. 3A, a coaxial cable). The PCB 361 may be coupled with a PCB having the communication module 350 disposed thereon through a coaxial cable by using, for example, the coaxial cable connector, and the coaxial cable may be used to transfer transmission and reception IF signals or RF signals. For another example, power or other control signals may be transferred through the B-to-B connector.

According to an embodiment, the first antenna array 363 or the second antenna array 364 may include a plurality of antenna elements. The antenna elements may include, for example, a patch antenna, a loop antenna, or a dipole antenna. For example, at least some of the plurality of antennas included in the first antenna array 363 may be a patch antenna to form a beam towards the back plate of the electronic device 300. For another example, at least some of the plurality of antennas included in the second antenna array 364 may be a dipole antenna or a loop antenna to form a beam towards the side member of the electronic device 300.

According to an embodiment, the communication circuit 362 may support at least some bands (e.g., 24 GHZ to 30 GHZ or 37 GHz to 40 GHz) among bands in the range of 20 GHz to 100 GHz. According to an embodiment, the communication circuit 362 may up-convert or down-convert frequencies. For example, the communication circuit 362 included in the communication device 360 (e.g., the first communication device 321 of FIG. 3A) may up-convert an IF signal received through a conductive line (e.g., the first conductive line 331 of FIG. 3A) from the communication module (e.g., the communication module 350 of FIG. 3A) into an RF signal. For another example, the communication circuit 362 included in the communication device 360 (e.g., the first communication device 321 of FIG. 3A) may down-convert an RF signal (e.g., a millimeter wave signal) received through the first antenna array 363 or the second antenna array 364 into an IF signal, and may transmit the signal to the communication module by using the conductive line.

Figure 4A:
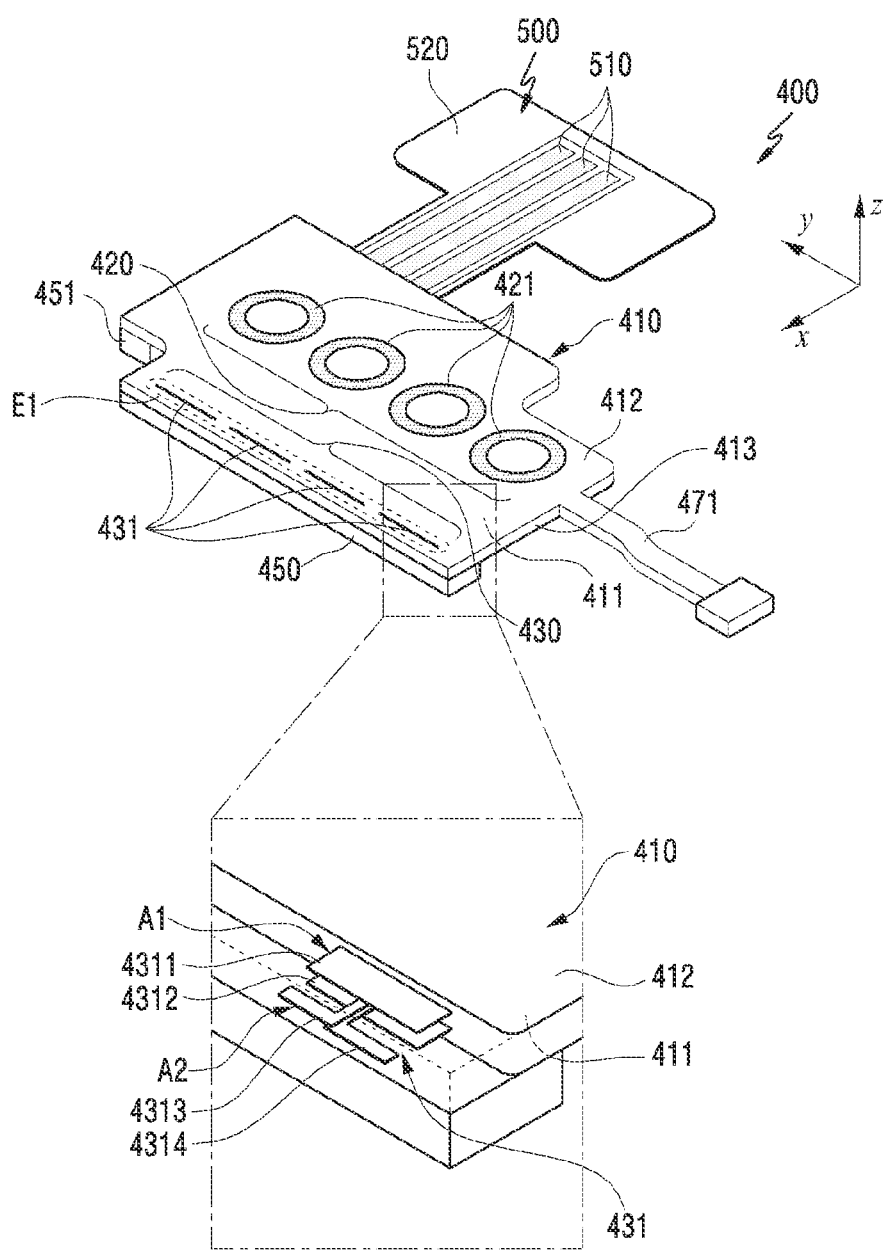
FIG. 4A and FIG. 4B is a perspective view of a communication device according to various embodiments of the disclosure.
Figure 4B:
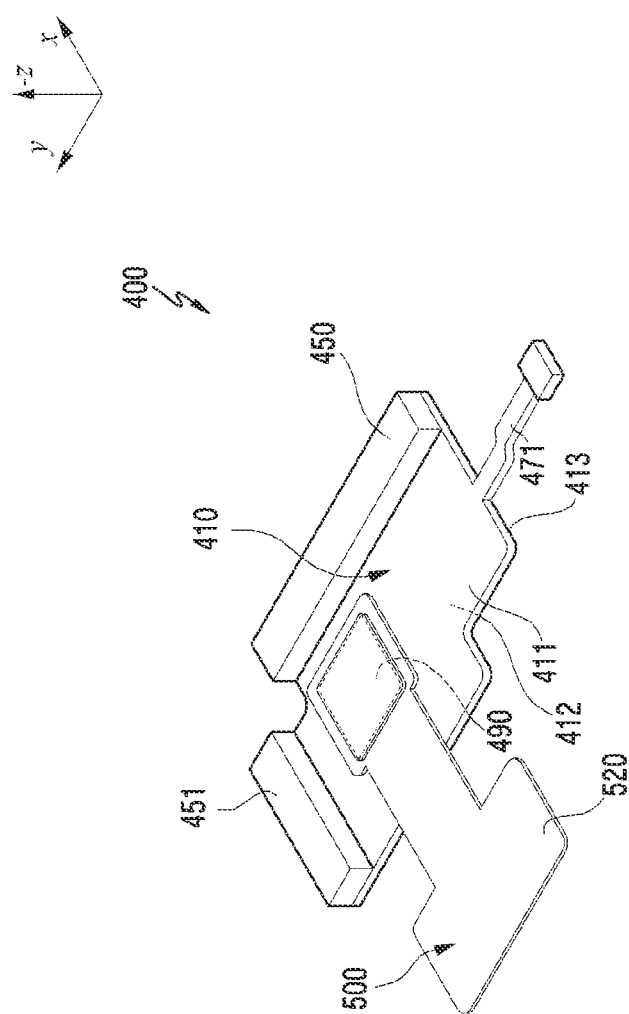

FIG. 4A and FIG. 4B are perspective views of a communication device according to various embodiments of the disclosure.

A communication device 400 of FIG. 4A and FIG. 4B may be at least in part similar to the communication devices 321, 322, 323, and 324 of FIG. 3A or the communication device 360 of FIG. 3B, or may include other embodiments of the communication device.

Referring to FIG. 4A and FIG. 4B, the communication device 400 may include a substrate 410 (e.g., a second PCB). According to an embodiment, the substrate 410 may include a first substrate face 411, a second substrate face 412 facing away from the first substrate face 411, a substrate side face 413 surrounding a space between the first substrate face 411 and the second substrate face 412. According to an embodiment, the substrate 410 may be disposed such that the second substrate face 412 faces a back plate (e.g., the back plate 211 of FIG. 2B) of the electronic device (e.g., the electronic device 200 of FIG. 2B). In another embodiment, the second substrate face 412 of the substrate 410 may be disposed to face a side member (e.g., the side member 218 of FIG. 2A) or a front plate (e.g., the front plate 202 of FIG. 2A) of the electronic device.

According to various embodiments, the communication device 400 may include at least one of a first antenna array 420, second antenna array 430, and third antenna array 440 disposed to the substrate 410. According to an embodiment, the first antenna array 420 may be disposed such that a beam pattern is formed in a z-axis direction through the second substrate face 412 of the substrate 410. According to an embodiment, the second antenna array 430 may be disposed such that a beam pattern is formed in an x-axis direction in a first edge region E1 of the substrate 410.

According to various embodiments, the first antenna array 420 may include a plurality of first unit antennas 421 disposed with a specific interval to the second substrate face 412 of the substrate 410. The plurality of first unit antennas 421 may include an antenna element constructed in the form of a metal patch or a conductive pattern. According to an embodiment, the second antenna array 430 may include a plurality of second unit antennas 431 disposed with a specific antenna to the first edge region E1 in the second substrate face 412 of the substrate 410.

According to various embodiments, the communication device 400 may include a first wireless communication circuit 490 (e.g., a second electronic component) mounted on the first substrate face 411 of the substrate 410 and electrically coupled to the antenna arrays 420 and 430. According to an embodiment, the first wireless communication circuit 490 may be configured to transmit/receive a signal having a frequency band in the range of 10 GHz to 100 GHz through the plurality of antenna arrays 420 and 430.

According to various embodiments, each of the plurality of second unit antennas 431 of the second antenna array 430 may include a first antenna A1 and a second antenna A2. According to an embodiment, the first antenna A1 may include a first antenna element 4311 and a second antenna element 4312. According to an embodiment, when viewed from above the second substrate face 412 of the substrate 410, the first antenna element 4311 and the second antenna element 4312 may be disposed to be spaced apart with a specific interval at a location where at least some regions overlap with each other. According to an embodiment, the first wireless communication circuit 490 may transmit/receive a vertically polarized wave through the first antenna element 4311 and the second antenna element 4312. According to an embodiment, the first antenna element 4311 and the second antenna element 4312 may be constructed in the form of a metal plate or metal patch. According to an embodiment, a second antenna A2 may include the third antenna element 4313 and the fourth antenna element 4314. According to an embodiment, the third antenna element 4313 and the fourth antenna element 4314 may be disposed in parallel, and may be disposed in a space between the first antenna element 4311 and the second antenna element 4312. According to an embodiment, the first wireless communication circuit 490 may transmit/receive a horizontally polarized wave through the third antenna element 4313 and the fourth antenna element 4314. According to an embodiment, the third antenna element 4313 and the fourth antenna element 4314 may be constructed in the substrate 410 as a dipole radiator in the form of a metal pattern. According to an embodiment, the communication device 400 may include at least one electrical coupling member to be electrically coupled to a Printed Circuit Board (PCB) (e.g., a first PCB) of the electronic device through at least some regions of the substrate 410. According to an embodiment, the electrical coupling member may include an FPCB 471. According to an embodiment, the electrical coupling member may be constructed together with one FPCB. For example, although it is illustrated that the FPCB 471 is coupled to the substrate 410 in an integral manner, it may also be assembled in a separate manner. At least one of an RF signal and a communication signal may be transmitted to the FPCB 471, and a coaxial cable (not shown) may be used according to various embodiments.

According to various embodiments, the communication device 400 may include one or more dielectric structures 450 and 451 disposed to the first substrate face 411 of the substrate 410 to have a thickness. According to an embodiment, the one or more dielectric structures 450 and 451 may include the first dielectric structure 450 disposed to the first substrate face 411 to at least partially overlap with the first edge region E1 of the substrate 410 and the second dielectric structure 451 disposed to at least partially overlap with the second edge region E2 of the substrate 410. According to an embodiment, the first dielectric structure 450 and/or the second dielectric structure 451 may be constructed of the same material (e.g., a Flame Retardant4 (FR4)) of the substrate 410 or may be constructed of a polymer material. According to an embodiment, the first dielectric structure 450 and the second dielectric structure 451 may mitigate distortion of a signal radiated from the second antenna array 430. For example, the first dielectric structure 450 and the second dielectric structure 451 may mitigate a null region (e.g., a region in which a size of a beam pattern is decreased) which is present at a contact point of a front plate (e.g., the front plate 202 of FIG. 2A) of an electronic device (e.g., the electronic device 200 of FIG. 2A) having a different permittivity and a housing (e.g., the housing 210 of FIG. 2A), or a back plate (e.g., the back plate 211 of FIG. 2A) and the housing.

According to various embodiments, the communication device 400 may include a second heat transfer structure 500 disposed to surround the wireless communication circuit 490 for noise shielding and heat radiation after being mounted on the first substrate face 411 of the substrate 410. According to an embodiment, the second heat transfer structure 500 may be disposed to be physically in contact with a first heat transfer structure (e.g., a first heat transfer structure 250 of FIG. 8B) disposed to an inner space of the electronic device. Therefore, noise and/or heat generated from the wireless communication circuit 490 may be radiated through the second heat transfer structure 500.

According to various embodiments, the second heat transfer structure 500 may be constructed such that a first thermal conductive layer 510 and at least some regions of a second electrical conductive layer 520 are attached to each other. According to an embodiment, the first thermal conductive layer 510 may perform a function for conducting heat radiated from the wireless communication circuit 490, and the second electrical conductive layer 520 may perform a function of effectively shielding noise generated from the wireless communication circuit 490. According to an embodiment, the first thermal conductive layer 510 may be disposed to be closer to the wireless communication circuit 490 than the second electrical conductive layer 520, or to be in contact with at least part of the wireless communication circuit 490. According to an embodiment, the second electrical conductive layer 520 may be constructed to have a larger area than the first thermal conductive layer 510. In another embodiment, the second electrical conductive layer 520 may have the same size as the first thermal conductive layer 510. According to an embodiment, the first thermal conductive layer 510 may include graphite. According to an embodiment, the second electrical conductive layer 520 may include a metal foil. According to an embodiment, the second electrical conductive layer 520 may include copper (Cu).

Figure 5:
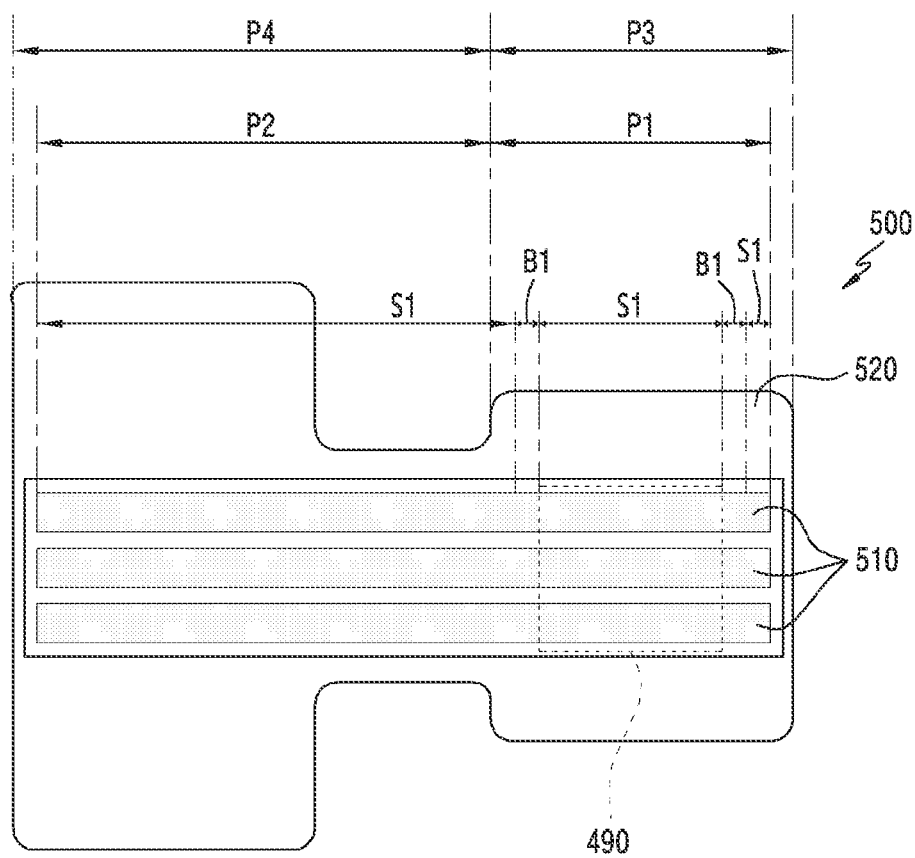
FIG. 5 illustrates a configuration for a heat transfer structure according to various embodiments of the disclosure.

FIG. 5 illustrates a configuration for a heat transfer structure 500 according to various embodiments of the disclosure.

The heat transfer structure of FIG. 5 may be at least in part similar to the second heat transfer structure of FIG. 4A and FIG. 4B, or may include other embodiments of the heat transfer structure.

Referring to FIG. 5, a heat transfer structure (e.g., the second heat transfer structure 500 of FIG. 4B) may include a first thermal conductive layer 510 and a second electrical conductive layer 520 attached to the first thermal conductive layer 510. According to an embodiment, the first thermal conductive layer 510 may include graphite. According to an embodiment, the second electrical conductive layer 520 may include copper. According to an embodiment, the second electrical conductive layer 520 may be applied in the form of a copper foil. According to an embodiment, the first thermal conductive layer 510 may include a first portion P1 actually attached to the wireless communication circuit 490 and a second portion P2 extending from the first portion P1. According to an embodiment, the second electrical conductive layer 520 may include a third portion P3 to which the first portion P1 of the first thermal conductive layer 510 is attached and a fourth portion P4 to which the second portion P2 of the first thermal conductive layer 510 is attached. According to an embodiment, the first portion P1 may include a straight portion Si and a curved portion B1 extending by a specific length from the straight portion S 1, so as to be curved toward a side face of the wireless communication circuit 490 after being attached to the wireless communication circuit 490 having a height. According to an embodiment, the straight portion Si may extend with the second portion P2. According to an embodiment, the straight portion Si may be disposed to extend in the first portion P1 with the curved portion B1 therebetween.

Figure 6:
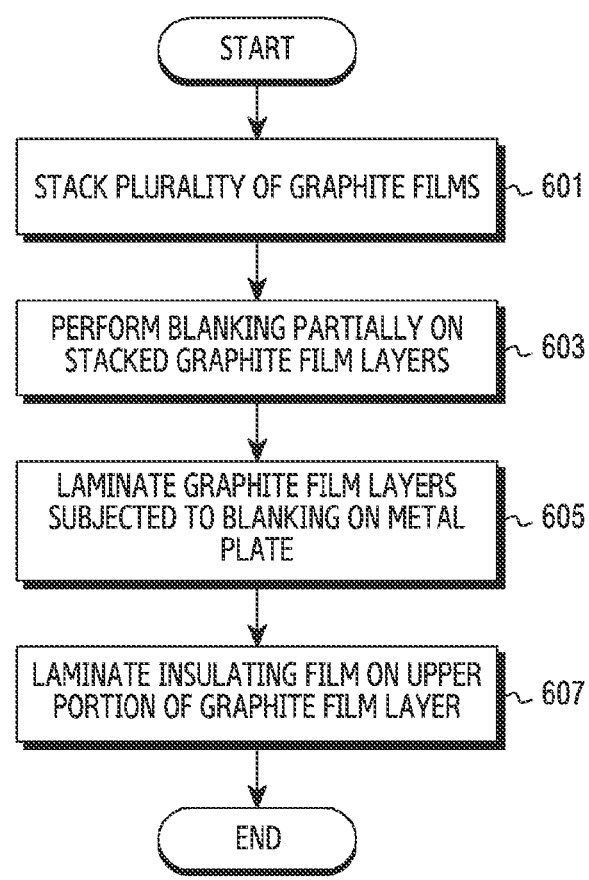
FIG. 6 is a process diagram illustrating a process of manufacturing a heat transfer structure according to various embodiments of the disclosure.
Figure 7A:
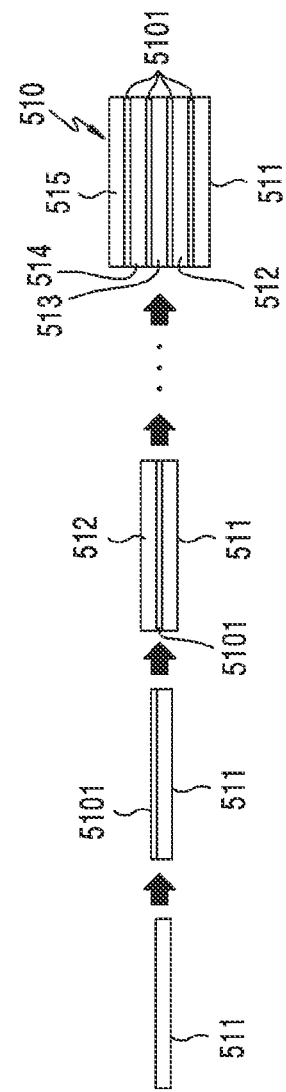
FIGS. 7A, 7B and 7C are a schematic diagram illustrating a process of manufacturing a heat transfer structure according to various embodiments of the disclosure.
Figure 7B:
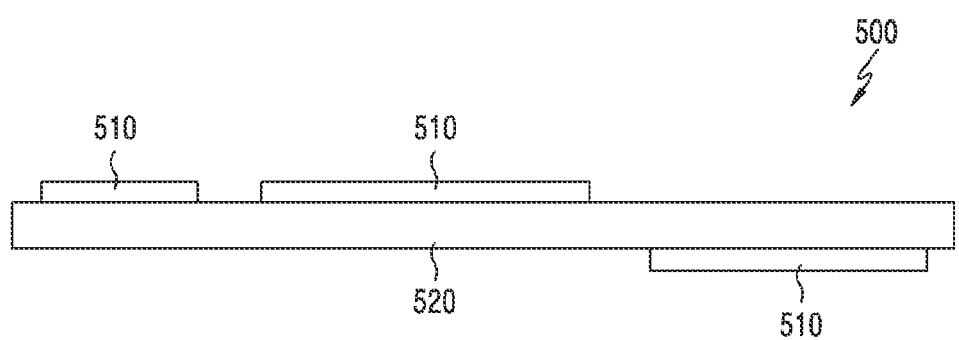
Figure 7C:
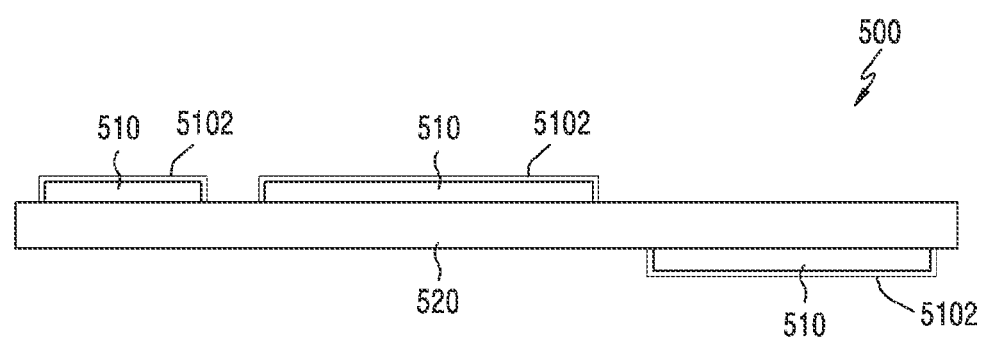

FIG. 6 is a process diagram illustrating a process of manufacturing a heat transfer structure (e.g., the heat transfer structure 500 of FIG. 5) according to various embodiments of the disclosure. FIG. 7A to FIG. 7C are schematic diagrams illustrating a process of manufacturing a heat transfer structure 500 according to various embodiments of the disclosure.

Referring to FIG. 6 and FIG. 7A to FIG. 7C, according to various embodiments, in operation 601, a plurality of graphite films 511, 512, 513, 514, and 515 may be sequentially stacked. For example, the plurality of graphite films 511, 512, 513, and 514 are not necessarily limited to a 5-layer stack structure, and may be configured as an at most 4-layer or at least 6-layer stack structure.

According to an embodiment, as shown in FIG. 7A, in order to construct a first thermal conductive layer 510 of a heat transfer structure (e.g., the heat transfer structure 500 of FIG. 7B), the plurality of graphite films 511, 512, 513, 514 may be sequentially stacked by using a double-sided tape 5101. According to an embodiment, the double-sided tape 5101 may include a thermal conductive tape. In another embodiment, instead of the double-sided tape 5101, it may be replaced with a viscous adhesive which is solidified after a specific period of time elapses.

According to various embodiments, in operation 603, the stacked graphite film layer 510 (e.g., the first thermal conductive layer) may be partially subjected to blanking. According to an embodiment, as shown in FIG. 7B, the graphite film layer (or the first thermal conductive layer) 510 may be partially subjected to blacking through a punching, cutting, or pressing process.

According to various embodiments, in operation 605, the graphite film layer 510 subjected to blanking may be laminated on a metal plate (or the second electrical conductive layer) 520 (e.g., a Cu foil). In this case, the graphite film layer 510 may be attached to the metal plate 520 through a double-sided tape or a thermal conductive adhesive.

According to various embodiments, in operation 607, as shown in FIG. 7C, an insulating layer 5102 may be disposed to surround the graphite film layer 510 attached to the metal plate. According to an embodiment, the insulating layer 5102 may prevent the graphite film layer 510 from being lifted from the metal plate 520 due to a characteristic of the heat transfer structure 500 which is at least partially bent. According to an embodiment, the insulating layer 5102 may include a colored (e.g., black) or transparent single-sided tape or film.

Figure 7D:
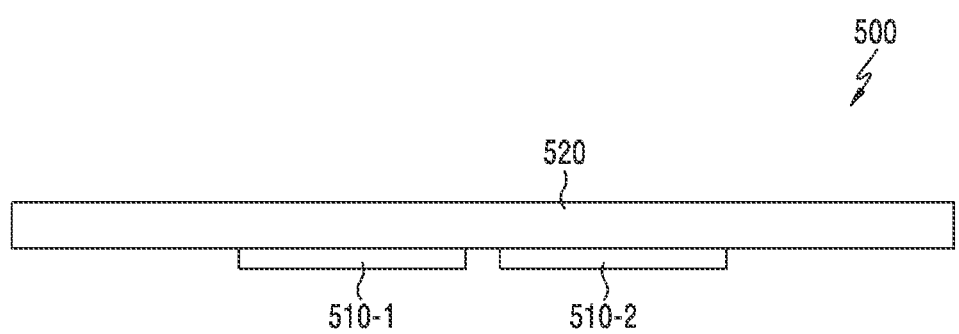
FIG. 7D is a drawing illustrating a state where a metal plate of a heat transfer structure is vertical according to various embodiments of the disclosure.
Figure 7E:
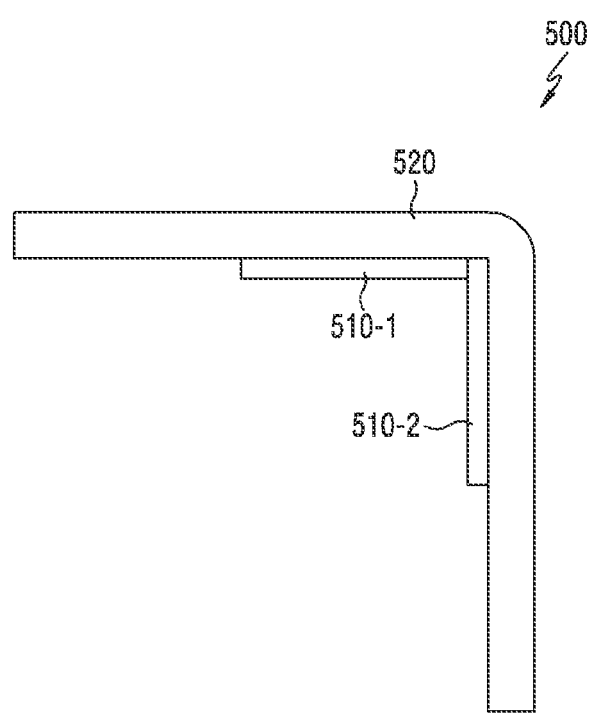
FIG. 7E is a schematic diagram illustrating a state where first and second graphite films are folded by bending the metal plate of FIG. 7D.

Referring to FIG. 7D and FIG. 7E, a heat transfer structure 500 (e.g., the heat transfer structure 500 of FIG. 7C) according to various embodiments may be a structure spaced apart or in contact with each of a first graphite film layer 510-1 and a second graphite film layer 510-2 (e.g., the graphite film layer 510 of FIG. 7C) according to whether a metal plate 520 (e.g., the metal plate 520 of FIG. 7C) is bent. When the metal plate 520 is bent with a first angle, the first graphite film layer 510-1 and the second graphite film layer 510-2 which are spaced apart from each other and attached to one face of the metal plate 520 in a horizontal state (e.g., a linear state) may be in contact with each other. For example, the first angle may be approximately 90 degrees. According to various embodiments, when in a state where the metal plate 520 is horizontal, the first graphite film layer 510-1 and the second graphite film layer 510-2 may remain in a state of being spaced apart from each other, and when in a state where the metal plate 520 is bent, the first graphite film layer 510-1 and the second graphite film layer 510-2 may be coupled in contact with each other.

The heat transfer structure 500 according to various embodiments may further include an additional heat transfer means between the first graphite film layer 510-1 and the second graphite film layer 510-2.

Figure 8A:
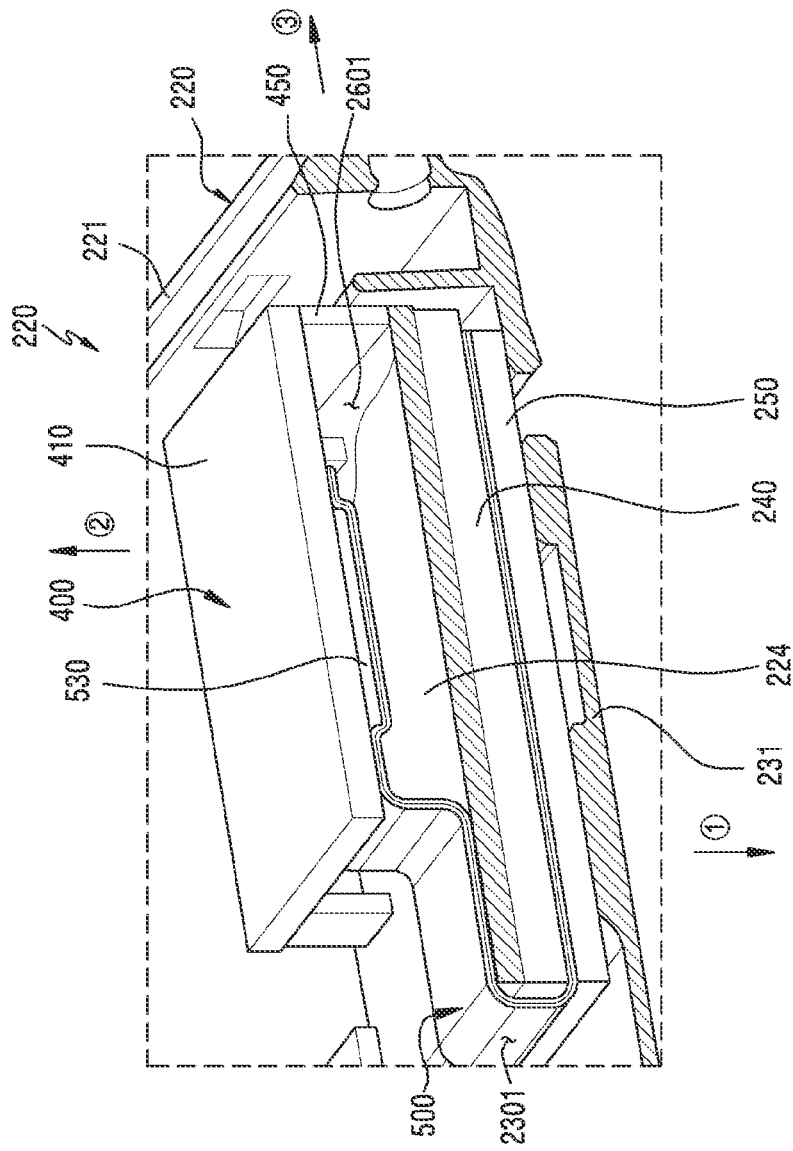
FIG. 8A is a partial perspective view of an electronic device to which a heat transfer structure is applied according to various embodiments of the disclosure.
Figure 8B:
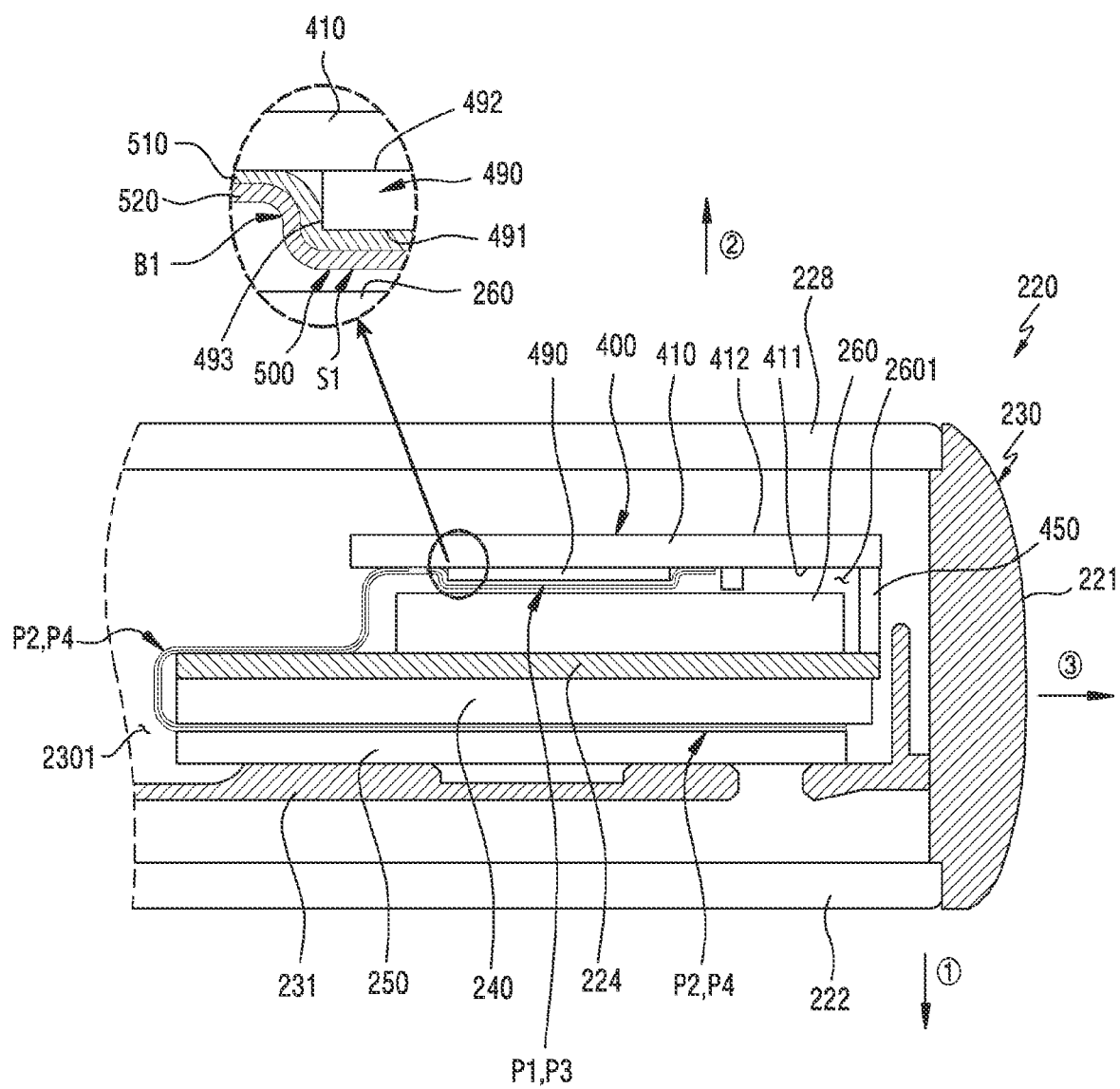
FIG. 8B is a cross-sectional view illustrating essential components of an electronic device to which a heat transfer structure is applied according to various embodiments of the disclosure.

FIG. 8A is a partial perspective view of an electronic device to which a heat transfer structure is applied according to various embodiments of the disclosure. FIG. 8B is a cross-sectional view illustrating essential components of an electronic device to which a heat transfer structure is applied according to various embodiments of the disclosure.

Referring to FIG. 8A and FIG. 8B, an electronic device 220 may include a housing 230 including a first plate 222 (e.g., the front plate 222 of FIG. 2C) facing a first direction (a direction ①), a second plate 228 (e.g., the back plate 228 of FIG. 2C) facing a second direction (a direction ②) facing away from the first plate 222, and a side member 221 surrounding a space 2301 between the first plate 222 and the second plate 228. According to an embodiment, the electronic device 220 may include a middle plate 231 (e.g., the first support structure 2211 of FIG. 2C) disposed in the space 2301 between the first plate 222 and the second plate 228 in parallel with the second plate 228. According to an embodiment, the electronic device 220 may include a first Printed Circuit Board (PCB) 224 (e.g., the PCB 224 of FIG. 2C) disposed in the space 2301 between the second plate 228 and the middle plate 231. According to an embodiment, a first electronic component 240 mounted on the first PCB 224 may be included between the first PCB 224 and the middle plate 231. According to an embodiment, the first electronic component 240 may include a shield can. According to an embodiment, the electronic device 220 may include a first heat transfer structure 250 disposed between the first electronic component 240 and the middle plate 231. According to an embodiment, the first heat transfer structure 250 may include any one of a Thermal Interface Material (TIM) structure, a heat radiating structure or heat pipe having excellent thermal conductivity, and a vapor chamber, or a combination of at least two of them.

According to various embodiments, a second PCB 410 (e.g., the substrate 410 of FIG. 4A) of the communication device 400 may be disposed in the space 2301 of the electronic device 220. According to an embodiment, a second electronic component 490 (e.g., the wireless communication circuit 490 of FIG. 4A) may be disposed to a first substrate face 411 of the second PCB 410. According to an embodiment, the second electronic component 490 may be mounted to face a first direction (a direction ①) from the first substrate face 411 of the second PCB 410. Therefore, an antenna (e.g., the first antenna array 420 of FIG. 4A) disposed to the second PCB 410 may be constructed in a direction (a direction ②) facing the back plate 228 of the electronic device 220. According to an embodiment, the second electronic component 490 may include a first surface 491 facing the first direction (the direction ①), a second surface 492 facing the second direction (the direction ②) facing away from the first surface 491, and a side face 493 constructed to be substantially vertical to the first surface 491 and/or the second surface 492.

According to various embodiments, the electronic device 220 may include a second heat transfer structure 500 disposed in the space 2301. According to an embodiment, a first portion P1 of a first thermal conductive layer 510 of the second heat transfer structure 500 and a third portion P3 of a second electrical conductive layer 520 may be disposed to be adjacent to or physical in contact with the first surface 491 of the second electronic component 490. According to an embodiment, a second portion P2 of the first thermal conductive layer 510 and a fourth portion P4 of the second electrical conductive layer 520 which extend respectively from the first portion P1 of the first thermal conductive layer 510 of the second heat transfer structure 500 and the third portion P3 of the second electrical conductive layer 520 may be disposed between the first electronic component 240 and the first heat transfer structure 250 by detouring the first PCB 224. According to an embodiment, the second portion P2 and the fourth portion P4 may be disposed to be adjacent to or in contact with the first heat transfer structure 250.

According to various embodiments, heat radiated from the second electronic component 490 may be transferred from the first portion P1 of the first thermal conductive layer 510 of the second heat transfer structure 500 to the first heat transfer structure 250 through the third portion P3, and thereafter may be spread through the metal middle plate 231 disposed in contact with the first heat transfer structure 250. In addition, noise emitted from the second electronic component 490 may be shielded by the second electrical conductive layer 520 attached together with the first thermal conductive layer 510.

According to various embodiments, the first thermal conductive layer 510 and second electrical conductive layer 520 of the second heat transfer structure 500 may be disposed to be curved by a side face of the second electronic component 490 having a height in the first portion P1 and the third portion P3. For example, a straight portion Si of the first portion P1 may be in contact with the first surface 491 of the second electronic component 490, and a curved portion B1 may be attached to the side face 493 of the second electronic device 490 by being curved with a specific curvature. According to an embodiment, the second heat transfer structure 500 is implemented in the form of a film by laminating a material having excellent thermal conductivity (e.g., graphite) and a material having excellent noise shielding performance (e.g., copper). Therefore, to improve an assembly property, the first portion P1 and the third portion P3 may be temporarily molded by using a jig according to a height of the second electronic component 490, and thereafter may be attached to the second PCB 410 in a thermally compressed manner by using a press.

According to various embodiments, in a space 2601 constructed by a dielectric 450, the existing shield can may be excluded, and the second heat transfer structure 500 in the form of a film may be applied to the second PCB 410 for the purpose of heat radiation and noise shielding. Therefore, an additional component 260 may be mounted in the space 2601, or it may contribute to make the electronic device 220 slim.

FIG. 9 is a cross-sectional view illustrating essential components of an electronic device to which a heat transfer structure (e.g., a second heat transfer structure 500) is applied according to various embodiments of the disclosure.

Referring to FIG. 9, a second heat transfer structure 500 may be disposed on a second PCB 410 of a communication device 400 in the same manner as the second heat transfer structure 500 of FIG. 8B. According to an embodiment, the second PCB 410 of the communication device may be disposed such that a beam pattern is formed in a lateral direction (a direction ③) unlike in the configuration of FIG. 8B. According to an embodiment, a first surface 491 of a second electronic component 490 may be disposed to be substantially vertical to a first plate (e.g., the first plate 222 of FIG. 8B), and a second surface 492 may be disposed to face a side member 221. In this case, a first thermal conductive layer 510 may be attached to the first surface 491, and a second electrical conductive layer 520 may be disposed at least partially between a first portion P1 and a first PCB 224.

According to various embodiments, the second heat transfer structure 500 is implemented in the form of a film by laminating a material having excellent thermal conductivity (e.g., graphite) and a material having excellent noise shielding performance (e.g., copper). Therefore, an effective heat radiation operation can be performed while being disposed to be separated from the first PCB 224. In addition, various mounting freedom degrees for the communication device 400 operating in an ultra-high frequency band can be secured.

FIG. 10A to FIG. 10D are configuration diagrams illustrating a shape of a thermal conductive layer in a heat transfer structure according to various embodiments of the disclosure.

According to various embodiments, a second electrical conductive layer of a second heat transfer structure is constructed of copper and thus has excellent flexibility, but a first thermal conductive layer is constructed of graphite and thus has poor flexibility. For example, the graphite may be damaged by excessive bending, and is not easily bent. Therefore, a bent portion in the first thermal conductive layer of the second heat transfer structure may have a different configuration so as to have better flexibility in other portions.

Figure 10A:
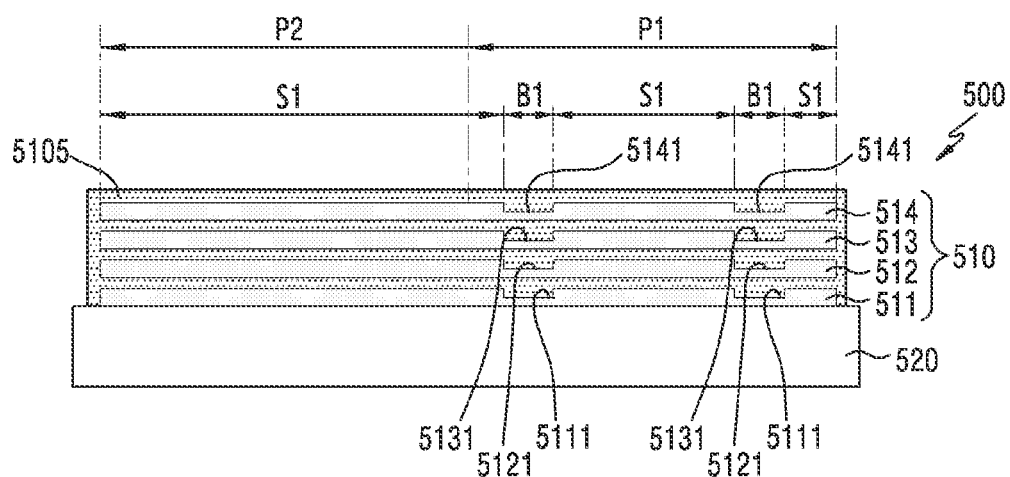
FIG. 10A to FIG. 10D is

Referring to FIG. 10A, a portion corresponding to a bent portion B1 disposed on a first portion P1 of the first thermal conductive layer 510 may be constructed to have step portions 5111, 5121, 5131, and 5141 lower than peripheries when a plurality of graphite films 511, 512, 513, and 514 are constructed. Therefore, when the plurality of graphite film layers 511, 512, 513, and 514 are laminated by means of an adhesive 5105, the bent portion B1 may have a graphite-occupied region smaller than a periphery region due to the step portions 5111, 5121, 5131, and 5141, and bendability may be improved in the bent portion B1 due to such a configuration. For example, the plurality of graphite films 511, 512, 513, and 514 are not necessarily limited to a 4-layer stack structure, and may be configured as an at most 3-layer or at least 5-layer stack structure.

Figure 10B:
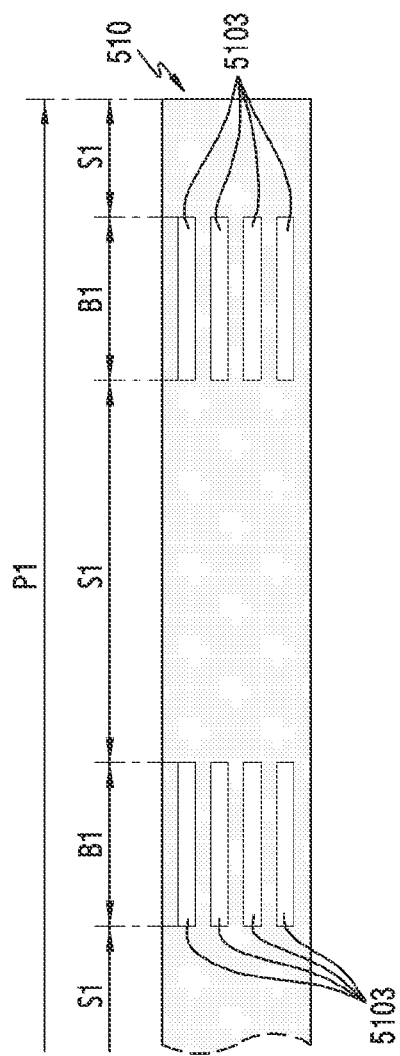

Referring to FIG. 10B, at least one slit 5103 is constructed in at least one bent portion B1 in the graphite film 510, and thus the bent portion B1 may have a graphite-occupied region smaller than a periphery region due to the slit 5103, thereby improving bendability in the bent portion B1 due to such a configuration.

Figure 10C:
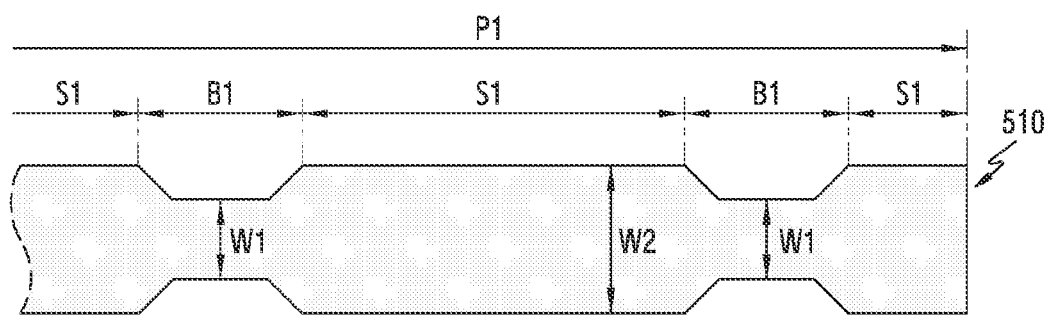

Referring to FIG. 10C, at least one bent portion B1 in the graphite film 510 is constructed to have a width W1 narrower than a width W2 of a periphery, and thus the bent portion B1 may have a graphite-occupied region smaller than a periphery region due to the relatively narrower width W1, thereby improving bendability in the bent portion B1 due to such a configuration.

Figure 10D:
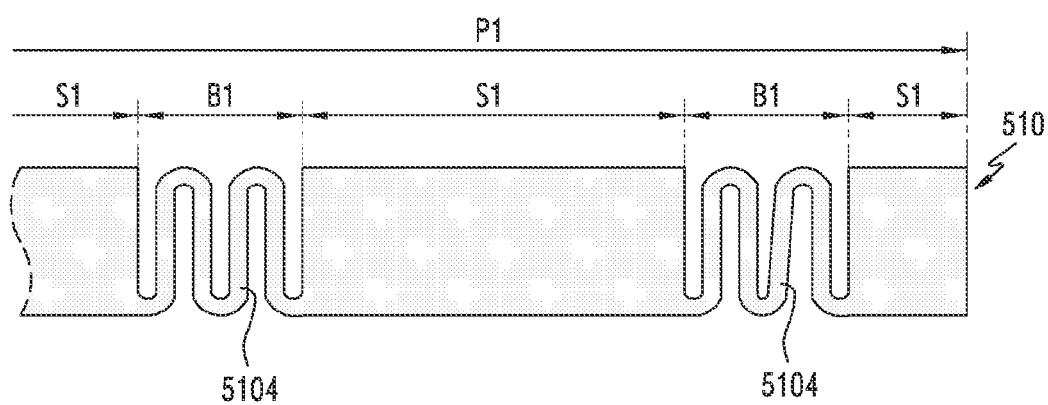

Referring to FIG. 10D, at least one bent portion B1 in the graphite film 510 is constructed as a bent portion 5104 which is bent multiple times in a zigzag shape having elasticity, and thus the bent portion B1 may have a graphite-occupied region smaller than a periphery region due to the bent portion 5104, thereby improving flexibility in the bent portion B1 due to a such a configuration.

Figure 11:
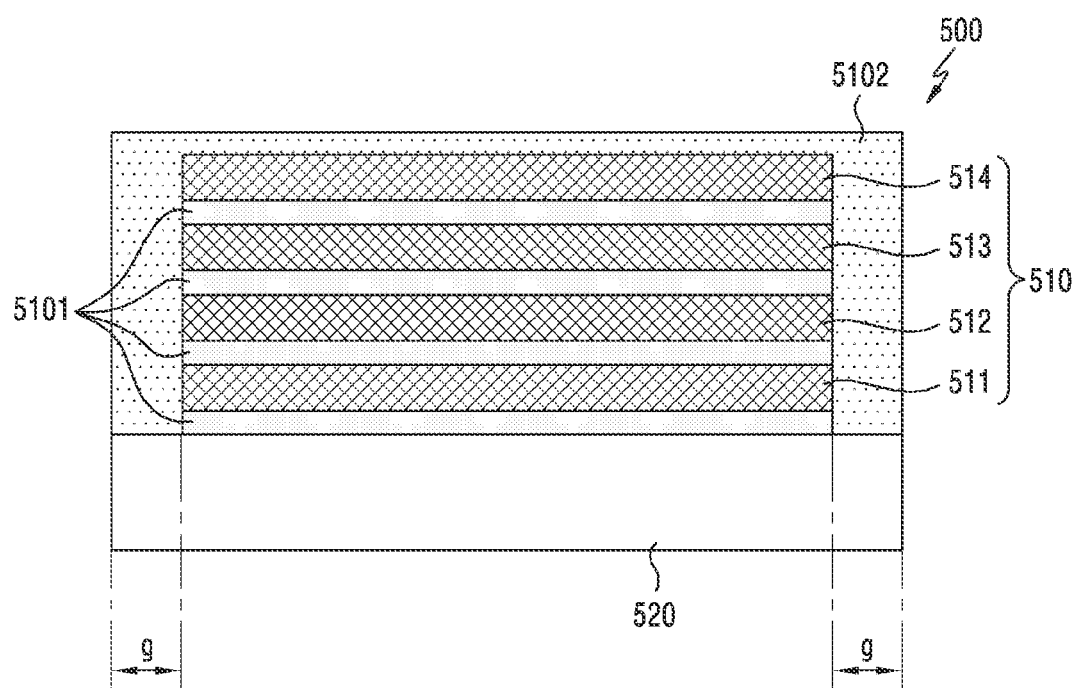
FIG. 11 is a cross-sectional view illustrating a configuration of a heat transfer structure according to various embodiments of the disclosure.

FIG. 11 is a cross-sectional view illustrating a configuration of a heat transfer structure 500 according to various embodiments of the disclosure.

The heat transfer structure 500 of FIG. 11 may be at least in part similar to the heat transfer structure 500 of FIG. 4A, or may include another embodiment of the heat transfer structure.

Referring to FIG. 11, the heat transfer structure 500 may have a plurality of graphite films 511, 512, 513, and 514 sequentially stacked thereon. According to an embodiment, in order to construct a first thermal conductive layer 510 of the heat transfer structure 500, the plurality of graphite films 511, 512, 513, 514 may be sequentially stacked by using a double-sided tape 5101. According to an embodiment, the double-sided tape 5101 may include a thermal conductive tape. In another embodiment, instead of the double-sided tape 5101, it may be replaced with a viscous adhesive which is solidified after a specific period of time elapses. For example, the plurality of graphite films 511, 512, 513, and 514 are not necessarily limited to a 4-layer stack structure, and may be configured as an at most 3-layer or at least 5-layer stack structure.

According to various embodiments, an insulating layer 5102 may be disposed to surround the graphite film layer 510 (or a first thermal conductive layer) attached to a metal plate (or a second electrical conductive layer) 520 of the heat transfer structure 500. According to an embodiment, the insulating layer 5102 may prevent the graphite film layer 510 from being lifted from the metal plate 520 due to a characteristic of the heat transfer structure 500 which is at least partially bent. According to an embodiment, the insulating layer 5102 may include a colored (e.g., black) or transparent single-sided tape or film.

Figure 12:
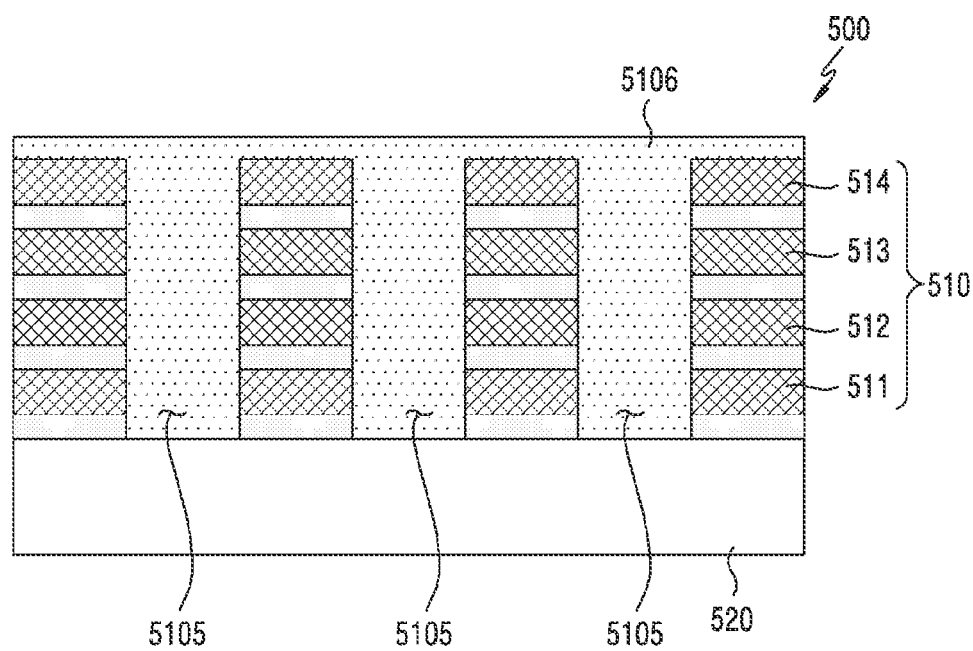
FIG. 12 is a cross-sectional view illustrating a configuration of a heat transfer structure according to various embodiments of the disclosure.

FIG. 12 is a cross-sectional view illustrating a configuration of a heat transfer structure 500 according to various embodiments of the disclosure.

The heat transfer structure 500 of FIG. 12 may be at least in part similar to the heat transfer structure 500 of FIG. 4A, or may include another embodiment of the heat transfer structure.

Referring to FIG. 12, similarly to FIG. 11, in order to prevent a graphite film layer (or a first thermal conductive layer) 510 from being lifted from a metal plate (or a second electrical conductive layer) 520, at least one through-hole 5105 may be constructed up to the metal plate to penetrate at least part of the graphite film layer 510, and thereafter an adhesive 5106 may be solidified by being infiltrated to the through-hole 5105. For example, a plurality of graphite films 511, 512, 513, and 514 are not necessarily limited to a 4-layer stack structure, and may be configured as an at most 3-layer or at least 5-layer stack structure.

Figure 13:
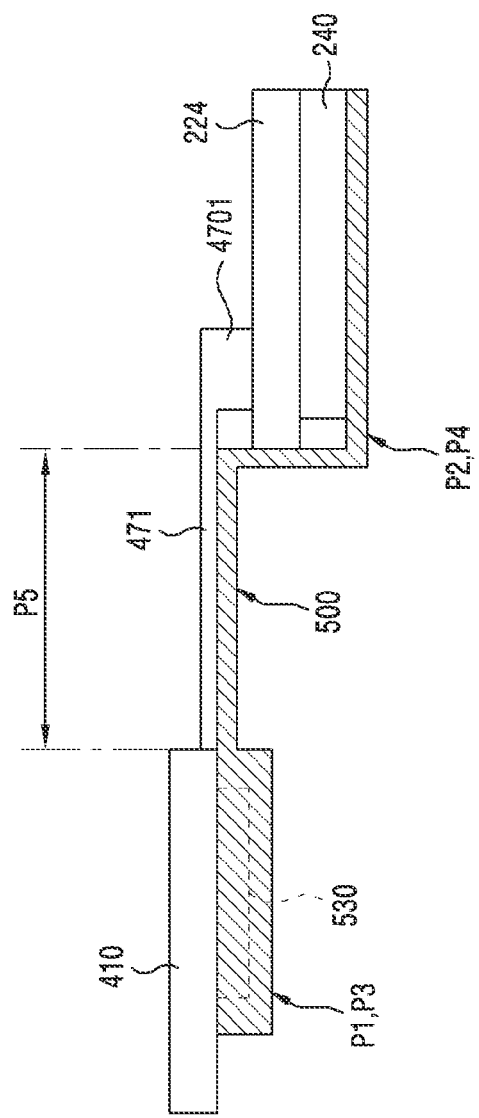
FIG. 13 is a diagram illustrating a state where a heat transfer structure is applied to a communication device according to various embodiments of the disclosure.

FIG. 13 is a diagram illustrating a state where a heat transfer structure is applied to a communication device according to various embodiments of the disclosure.

Referring to FIG. 13, an FPCB 471 which couples a substrate 410 of the communication device and a connector 4701 may be implemented together with a heat transfer structure 500. For example, heat radiated from a wireless communication circuit 530 (e.g., the wireless communication circuit 490 of FIG. 4A) disposed on the substrate 410 may be collected through a first portion P1 and third portion P3 of the heat transfer structure 500, and thereafter may be spread to a first electronic component 240 (e.g., a shield can) mounted on a first PCB 224 through a second portion P2 and a fourth portion P4. In this case, the FPCB 471 drawn out from the substrate 410 may be mutually attached to at least part of the heat transfer structure 500 by using a double-sided tape or in a bonding manner, and the connector 4701 may be electrically coupled to the first PCB 224.

Figure 14:
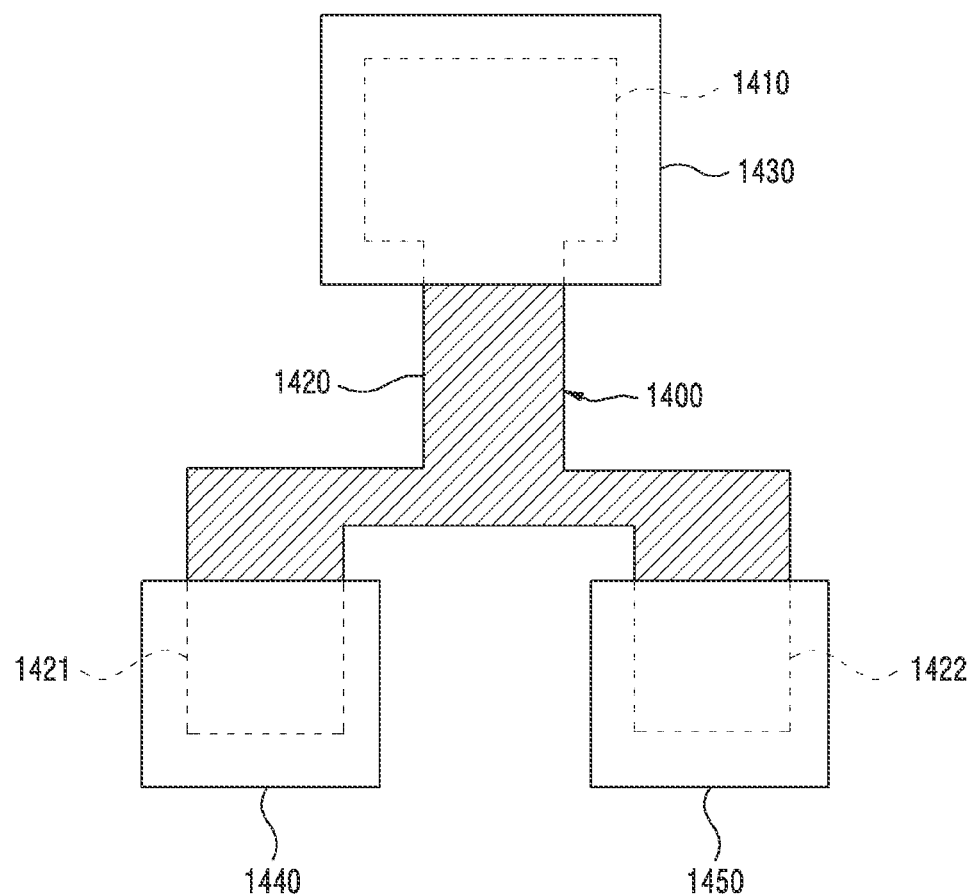
FIG. 14 is a configuration diagram of a heat transfer structure having a branched heat radiating structure according to various embodiments of the disclosure.

FIG. 14 is a configuration diagram of a heat transfer structure having a branched heat radiating structure according to various embodiments of the disclosure.

A heat transfer structure 1400 of FIG. 14 may be at least in part similar to the heat transfer structure 500 of FIG. 4A, or may include other embodiments of the heat transfer structure.

Referring to FIG. 14, the heat transfer structure 1400 is illustrated which branches heat collected from one heat source (e.g., the second electronic component 490 of FIG. 8B) to two heat radiating structures 1440 and 1450. According to an embodiment, the heat transfer structure 1400 may include a heat collection portion 1430, a connection portion 1420 extending from the heat collection portion 1430, and a first branch portion 1421 and second branch portion 1422 which are branched from the connection portion 1420. According to an embodiment, the first branching portion 1421 may be in contact with the first heat radiating structure 1440, and the second branching portion 1422 may be in contact with the second heat radiating structure 1450. Therefore, heat collected from the heat source 1410 may be collected through the heat collection portion 1430 of the heat transfer structure 1400, and is spread to the first heat radiating structure 1440 and the second heat radiating structure 1450 through the connection portion 1420 and the first and second branch portions 1421 and 1422, thereby inducing relatively fast heat radiation.

According to various embodiments, an electronic device (e.g., the electronic device 220 of FIG. 8B) may include a housing (e.g., the housing 230 of FIG. 8B) including a first plate (e.g., the first plate 222 of FIG. 8B), a second plate (e.g., the second plate 228 of FIG. 8B) facing away from the first plate, and a side member (e.g., the side member 221 of FIG. 8B) surrounding a space (e.g., the space 2301 of FIG. 8B) between the first plate and the second plate, a middle plate (e.g., the middle plate 231 of FIG. 8B) disposed in the space between the first plate and the second plate in parallel with the second plate, a first Printed Circuit Board (PCB) (e.g., the first PCB 224 of FIG. 8B) disposed in a space between the second plate and the middle plate, a first electronic component (e.g., the first electronic component 240 of FIG. 8B) mounted on the first PCB between the first PCB and the middle plate, a first heat transfer structure (e.g., the first heat transfer structure 250 of FIG. 8B) disposed between the first electronic component and the middle plate, a second electronic component (e.g., the second electronic component 490 of FIG. 8B) including a first surface (e.g., the first surface 491 of FIG. 8B) disposed in the space and spaced apart from the first PCB, a second surface (e.g., the second surface 492 of FIG. 8B) facing away from the first surface, and a side face (e.g., the side face 493 of FIG. 8B) substantially perpendicular to the first surface or the second surface, and a second heat transfer structure (e.g., the second heat transfer structure 600 of FIG. 8B). The second heat transfer structure may include a first thermal conductive layer (e.g., the first thermal conductive layer 510 of FIG. 8B) including a first portion (e.g., the first portion P1 of FIG. 5) attached to the first surface or the second surface, and a second portion (e.g., the second portion P2 of FIG. 5) extending from the first portion toward the middle plate and at least partially having a thermal conductive path between the second electronic component and the middle plate, and a second electrical conductive layer (e.g., the second electric conductive layer 520 of FIG. 8B) including a third portion (e.g., the third portion P3 of FIG. 5) attached to the first portion so that the third portion constructs an electromagnetic shielding structure for the second electric component.

According to various embodiments, the second electrical conductive layer may include a fourth portion (e.g., the fourth portion P4 of FIG. 5) attached to at least part of the second portion.

According to various embodiments, the second heat transfer structure may include a straight portion (e.g., the straight portion Si of FIG. 5) having a first thickness in the first thermal conductive layer and a curved portion (e.g., the curved portion B1 of FIG. 5) having a second thickness thinner than the first thickness.

According to various embodiments, the first surface may face the first plate, and the second surface may face the second plate. The first portion may be attached to the first surface, and the third portion may be at least partially disposed between the first portion and the first plate.

According to various embodiments, the first portion may at least partially surround the side face of the second electronic component.

According to various embodiments, the first surface may be disposed to be substantially vertical to the first plate to face a direction facing away from the side member, and the second face may be disposed to face the side member.

According to various embodiments, the first portion may be attached to the first surface, and the third portion may be at least partially disposed between the first portion and the first PCB. The third portion may at least partially surround the side face of the second electronic component.

According to various embodiments, the first thermal conductive layer may have a plurality of graphite films (e.g., the plurality of graphite films 511, 512. 513, 514, and 515) stacked by means of a double-sided tape (e.g., the double-sided tape 5101 of FIG. 7A) or a conductive adhesive.

According to various embodiments, the electronic device may further include an insulating layer (e.g., the insulating layer 5102 of FIG. 7C) disposed to surround the first thermal conductive layer.

According to various embodiments, the second heat transfer structure may include a straight portion having a first thickness in the first thermal conductive layer and a curved portion having a second thickness thinner than the first thickness. The plurality of graphite films may be constructed in the curved portion to have a lower step portion (e.g., the step portions 5111, 5121, 5131, and 5141 of FIG. 10A) than a periphery region.

According to various embodiments, the second heat transfer structure may include a straight portion and a curved portion in the first thermal conductive layer. The curved portion may include at least one slit (e.g., the slit 5103 of FIG. 10B).

According to various embodiments, the second heat transfer structure may include a straight portion and a curved portion in the first thermal conductive layer. A width of the curved portion (e.g., the width W1 of the curved portion of FIG. 10C) may be constructed to be narrower than a width of the straight portion (e.g., the width W2 of the straight portion of FIG. 10C).

According to various embodiments, the second heat transfer structure may include a straight portion and a curved portion in the first thermal conductive layer. The curved portion may include a bent portion (e.g., the bent portion 5104 of FIG. 10D) which is bent multiple times in an opposite direction up to the straight portion.

According to various embodiments, the electronic device may further include a second PCB (e.g., the second PCB 410 of FIG. 8C) disposed in a space between the first PCB and the second plate. The second electronic component may be mounted on the second PCB. At least part of a first portion and third portion of the second heat transfer structure may be attached to the second PCB by surrounding the second electronic component.

According to various embodiments, at least part of the second heat transfer structure may be disposed between the first electronic component and the first heat transfer structure.

In addition, embodiments of the disclosure disclosed in the specification and the drawing are merely a specific example presented for clarity and are not intended to limit the scope of the disclosure. Therefore, in addition to the embodiments disclosed herein, various changes in forms and details made without departing from the technical concept of the disclosure will be construed as being included in the scope of the disclosure.

What is claimed is:

1. An electronic device comprising:
a housing comprising a first plate, a second plate facing away from the first plate, and a side member surrounding a space between the first plate and the second plate;
a middle plate disposed in the space between the first plate and the second plate in parallel with the second plate;
a first Printed Circuit Board (PCB) disposed in a space between the second plate and the middle plate;
a first electronic component mounted on the first PCB between the first PCB and the middle plate;
a first heat transfer structure disposed between the first electronic component and the middle plate;
a second electronic component comprising a first surface disposed in the space and spaced apart from the first PCB, a second surface facing away from the first surface, and a side face perpendicular to the first surface or the second surface; and
a second heat transfer structure, wherein the second heat transfer structure comprises:
a first thermal conductive layer comprising a first portion attached to the first surface or the second surface, and a second portion extending from the first portion toward the middle plate and having a thermal conductive path between the second electronic component and the middle plate; and
a second electrical conductive layer comprising a third portion attached to the first portion so that the third portion constructs an electromagnetic shielding structure for the second electric component.

2. The electronic device of claim 1, wherein the second electrical conductive layer comprises a fourth portion attached to at least part of the second portion.

3. The electronic device of claim 2, wherein the second heat transfer structure comprises a straight portion having a first thickness in the first thermal conductive layer and a curved portion having a second thickness thinner than the first thickness.

4. The electronic device of claim 1,
wherein the first surface faces the first plate, and the second surface faces the second plate, and
wherein the first portion is attached to the first surface, and the third portion is disposed between the first portion and the first plate.

5. The electronic device of claim 4, wherein the first portion surrounds the side face of the second electronic component.

6. The electronic device of claim 1, wherein the first surface is disposed to be vertical to the first plate to face a direction facing away from the side member, and the second face is disposed to face the side member.

7. The electronic device of claim 6,
wherein the first portion is attached to the first surface, and the third portion is disposed between the first portion and the first PCB, and
wherein the third portion surrounds the side face of the second electronic component.

8. The electronic device of claim 1, wherein the first thermal conductive layer has a plurality of graphite films stacked by means of a double-sided tape or a conductive adhesive.

9. The electronic device of claim 8, further comprising an insulating layer disposed to surround the first thermal conductive layer.

10. The electronic device of claim 8,
wherein the second heat transfer structure comprises a straight portion having a first thickness in the first thermal conductive layer and a curved portion having a second thickness thinner than the first thickness, and
wherein the plurality of graphite films are constructed in the curved portion to have a lower step portion than a periphery region.

11. The electronic device of claim 1,
- wherein the second heat transfer structure comprises a straight portion and a curved portion in the first thermal conductive layer, and
- wherein the curved portion comprises at least one slit.

12. The electronic device of claim 1,
- wherein the second heat transfer structure comprises a straight portion and a curved portion in the first thermal conductive layer, and
- wherein the curved portion is constructed to have a narrower width than the straight portion.

13. The electronic device of claim 1,
- wherein the second heat transfer structure comprises a straight portion and a curved portion in the first thermal conductive layer, and
- wherein the curved portion comprises a bent portion which is bent multiple times in an opposite direction up to the straight portion.

14. The electronic device of claim 1, further comprising a second PCB disposed in a space between the first PCB and the second plate,
- wherein the second electronic component is mounted on the second PCB, and
- wherein at least part of a first portion and third portion of the second heat transfer structure is attached to the second PCB by surrounding the second electronic component.

15. The electronic device of claim 1, wherein at least part of the second heat transfer structure is disposed between the first electronic component and the first heat transfer structure.

* * * * *